US010252364B2

(12) United States Patent
Hiyama et al.

(10) Patent No.: US 10,252,364 B2
(45) Date of Patent: Apr. 9, 2019

(54) SOLDERING APPARATUS AND VACUUM-SOLDERING METHOD

(71) Applicant: Senju Metal Industry Co., Ltd., Tokyo (JP)

(72) Inventors: Tsutomu Hiyama, Tokyo (JP); Hiroyuki Inoue, Tokyo (JP); Shunsuke Kimoto, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 14 days.

(21) Appl. No.: 14/906,660

(22) PCT Filed: Jul. 23, 2013

(86) PCT No.: PCT/JP2013/069933
§ 371 (c)(1),
(2) Date: May 3, 2016

(87) PCT Pub. No.: WO2015/011785
PCT Pub. Date: Jan. 29, 2015

(65) Prior Publication Data
US 2016/0256946 A1     Sep. 8, 2016

(51) Int. Cl.
*B23K 1/00* (2006.01)
*B23K 1/008* (2006.01)
*H05K 3/34* (2006.01)

(52) U.S. Cl.
CPC .......... *B23K 1/008* (2013.01); *H05K 3/3494* (2013.01); *H05K 2203/085* (2013.01); *H05K 2203/163* (2013.01)

(58) Field of Classification Search
CPC ...... B23K 1/008; B23K 1/0016; B23K 1/012; H05K 3/3494; H05K 2203/085; F27B 5/04; F27B 9/045; F27B 9/047; F27B 9/243
(Continued)

(56) References Cited

U.S. PATENT DOCUMENTS 3,226,014 A * 12/1965 Petrovich .............. F04C 18/344
418/13
5,409,543 A *  4/1995 Panitz ...................... B23K 1/20
134/2
(Continued)

FOREIGN PATENT DOCUMENTS

JP            7330455 A    12/1995
JP             910927 A     1/1997
(Continued)

*Primary Examiner* — Erin B Saad
(74) *Attorney, Agent, or Firm* — The Webb Law Firm

(57) ABSTRACT

A soldering apparatus which can keep an interior of a chamber at a specified vacuum pressure and can perform soldering in the chamber, the vacuum pressure of which is optimally adjusted, is provided with a chamber (40) in which a work (1) is solderable under vacuum environment, an operation part (21) that inputs and sets vacuum pressure in the chamber (40), a pump (23) that performs vacuum drawing on the interior of the chamber (40), a pressure sensor (24) that detects pressure in the chamber (40), and a control portion (61) that adjusts the set vacuum pressure in the chamber (40) based on a pressure detection signal (S24) output from the pressure sensor (24), and keeps the set vacuum pressure for a predetermined period of time, as shown in FIG. 4.

15 Claims, 16 Drawing Sheets

(58) Field of Classification Search
USPC .......... 228/219, 8, 218, 220, 221; 219/85.1, 219/85.17
See application file for complete search history.

(56) References Cited

U.S. PATENT DOCUMENTS

| | | | |
|---|---|---|---|
| 6,334,569 | B1 | 1/2002 | Yoshimura |
| 6,348,099 | B1 * | 2/2002 | Xia ................. C23C 16/401 118/684 |
| 7,399,180 | B2 * | 7/2008 | Fuse ................. B23K 1/008 432/128 |
| 2006/0048710 | A1 | 3/2006 | Horiguchi et al. |
| 2007/0170227 | A1 * | 7/2007 | Ohno ................. B23K 1/008 228/101 |
| 2009/0218386 | A1 * | 9/2009 | Kimbara ............ B23K 1/0016 228/103 |
| 2010/0170939 | A1 | 7/2010 | Ishikawa |

FOREIGN PATENT DOCUMENTS

| | | |
|---|---|---|
| JP | 9314322 A | 12/1997 |
| JP | 200177524 A | 3/2001 |
| JP | 2004327816 A | 11/2004 |
| JP | 2010161206 A | 7/2010 |
| TW | 200416840 A | 9/2004 |

* cited by examiner

SOLDERING APPARATUS AND VACUUM-SOLDERING METHOD

CROSS-REFERENCE TO RELATED APPLICATION

This application is the United States national phase of International Application No. PCT/JP2013/069933 filed Jul. 23, 2013, the disclosure of which is hereby incorporated in its entirety by reference.

TECHNICAL FIELD

The present invention relates to a soldering apparatus and a vacuum-soldering method, which are applicable to a vacuum reflow furnace having a function to defoam/deaerate any voids from vacuum molten solder when mounting a surface mounting component or the like on a substrate at a predetermined position thereof and soldering the component and the substrate.

BACKGROUND

In the past, voids (air bubbles) generated in a normal hot blast (air) reflow processing during a reflow mounting process of large current device such as mounting process of power device and power module have been held in question. A method of allowing generation of any voids to be more reduced has been required.

FIGS. 13A and 13B are processing diagrams for showing the hot blast reflow processing according to a past example. Cream solder 8 shown in FIG. 13A is applied onto a pad electrode 4 of a substrate 5. The cream solder 8 is made by adding flux to solder powder so as to have suitable viscosity. It is applied onto the pad electrode 4 of the substrate 5 by a screen printer through a mask.

In the hot blast reflow processing according to the past example, the hot blast reflow processing is performed on the cream solder 8 and when the solder melts, voids 2 are generated in an interior thereof. Such a problem that when the molted solder 7 is cooled and solidified, these voids 2 remain in the solder as they are has occurred.

The following will schematically describe the voids generation in such a hot blast reflow processing condition that the cream solder 8 is applied onto the pad electrode 5 of the substrate 5 but the electronic component is not mounted, with reference to FIGS. 13A and 13B. The solder 3 shown in FIG. 13B is such a condition that after the hot blast reflow processing is performed on the cream solder 8 shown in FIG. 13A, the molten solder 7 is cooled so as to be spherically solidified by surface tension. Circular white portions in the drawing are voids 2 which are unexpectedly generated in the molten solder 7 and remain in the solder 3 after it is cooled and solidified. The voids 2 cause heat conduction effect to be missed in the power device or the like, so that this causes waste heat to bring about a change for the worse.

Regarding the above-mentioned reduction of the voids generation, patent document 1 discloses a soldering apparatus (vacuum reflow apparatus) having a vacuum evacuation function. This solder apparatus is provided with an exhaust valve, a vacuum pump and a treatment chamber. Under the condition in which the substrate is imported into the treatment chamber and the solder on the pad electrode of the substrate is melted, the exhaust valve is opened and the vacuum pump is driven so that the interior of the treatment chamber can exhaust to become temporarily vacuum condition. Such a vacuum condition allows any voids which remain in the solder as bubbles while the solder is melted to be removed by defoaming effect.

Patent Document 1: Japanese Patent Application Publication No. H09-314322.

SUMMARY OF THE INVENTION

By the way, by the vacuum reflow apparatus according to the past example, as disclosed in the patent document 1, the chamber (treatment chamber) becomes vacuum condition when performing the soldering step. In this moment, the vacuum pump is driven to generate the vacuum condition but according to the past system, a method of setting a period of vacuum processing time and keeping the vacuum pump running eagerly only during this set period of vacuum processing time has been adopted.

Accordingly, since the voids are defoamed/deaerated but degree of vacuum consecutively varies, the defoaming/deaeration suddenly occur. As a result thereof, while the voids 2 are defoamed/deaerated from the molten solder 7, they are absorbed toward a surface of the solder and merge with other voids 2 so that they are made larger by degrees. The largely assembled voids 2 burst, thereby causing flux or solder to be scattered.

In order to solve the above problems, a soldering apparatus claimed in Claim 1 is a soldering apparatus containing a chamber in which a work is solderable under vacuum environment, an operation part that inputs and sets plural vacuum pressures in the chamber, a pump that performs vacuum drawing on an interior of the chamber, a detection portion that detects pressure in the chamber, and a control portion that adjusts to the plural vacuum pressures set by the operation part based on detection information about the pressure in the chamber, the detection information being output from the detection portion, so as to perform multi-stage decompress from a start of the decompression by stages and keeps the set plural vacuum pressures for a predetermined period of time.

The soldering apparatus claimed in Claim 3, according Claim 1 includes a gas-supplying portion that supplies at least any one of activated gas and inert gas to the chamber, wherein the control portion adjusts an amount of the flowing gas which the gas-supplying portion supplies to the chamber.

In the soldering apparatus claimed in Claim 4, according to Claim 3, when keeping the set plural vacuum pressures for the predetermined period of time, the control portion controls the pump to maintain its number of revolution at a predetermined number based on the detection information about the pressure in the chamber, the detection information being received from the detection portion, and controls the amount of the flowing gas to the chamber so that it keeps the set plural vacuum pressures for the predetermined period of time.

In the soldering apparatus claimed in Claim 5, according to Claim 3, when keeping the set plural vacuum pressures for the predetermined period of time, the control portion controls the amount of the flowing gas to the chamber to be constant based on the detection information about the pressure in the chamber, the detection information being received from the detection portion, and controls number of revolution of the pump so that it keeps the set plural vacuum pressures for the predetermined period of time.

The soldering apparatus claimed in Claim 6, according to any one of Claims 1 and 3 through 5, includes a first heating portion that heats the work up to a predetermined temperature before the work enters into the chamber.

The soldering apparatus claimed in Claim 7, according to Claim 6, includes a second heating portion that keeps the work which is heated up to the predetermined temperature before the work enters into the chamber, at a predetermined temperature when the work enters into the chamber.

A vacuum-soldering method claimed in Claim 8 includes a step of inputting and setting plural vacuum pressures in the chamber in which a work is solderable under vacuum environment, a step of performing vacuum drawing on an interior of the chamber to which the plural vacuum pressures are set, a step of detecting pressure in the chamber, a step of adjusting the plural vacuum pressures in the chamber based on detection information about the pressure in the chamber and the set plural vacuum pressures so as to perform multistage decompress from a start of the decompression by stages, a step of keeping the set plural vacuum pressures for a predetermined period of time, and a step of performing the soldering in the chamber in which the plural vacuum pressures are adjusted.

The vacuum-soldering method claimed in Claim 10, according to Claim 8, includes a step of heating the work up to a predetermined temperature before the work enters into the chamber.

The vacuum-soldering method claimed in Claim 11, according to Claim 10 includes a heating step of keeping the work which is heated up to the predetermined temperature before the work enters into the chamber, at a predetermined temperature when the work enters into the chamber.

According to the soldering apparatus and the vacuum-soldering method of this invention, the control portion is provided to adjust the vacuum pressure in the chamber to meet the set plural vacuum pressures based on detection information about the pressure in the chamber so as to perform multistage decompress from a start of the decompression by stages, and to keep the set plural vacuum pressures for a predetermined period of time.

By such a configuration, it is possible to keep the pressure in the chamber at the specified vacuum pressure so that the soldering can be performed in the chamber, the vacuum pressure of which is optimally adjusted. The voids 2 in the molten solder attaining to a target pressure are gradually defoamed/deaerated therefrom by vacuum drawing at constant pressure. This prevents the flux and/or solder from being scattered so that the vacuum soldering with high quality by which the voids are reduced can be performed under the set vacuum pressure. Further, decompression can be realized by specifying vacuum pressure to be targeted (hereinafter, referred to as "target pressure") on the way of the vacuum drawing by setting vacuum processing time in which work is multiplied by intermittent waiting unit time (Vacuum Processing Time=work(s)·intermittent waiting unit time). This enables the vacuum soldering under optimal vacuum pressure to be realized. Here, the "work(s)·intermittent waiting unit time" is referred to as "a period of time when the work stops at a place where the work is intermittently transferred by unit transfer distance (pitch)".

DESCRIPTION OF THE INVENTION

This invention has solved these problems and has an object to present a soldering apparatus and a vacuum-soldering method, which can keep an interior of a chamber at a specified vacuum pressure for a predetermined period of time and can perform soldering in the chamber, the vacuum pressure of which is optimally adjusted.

Figure 1:
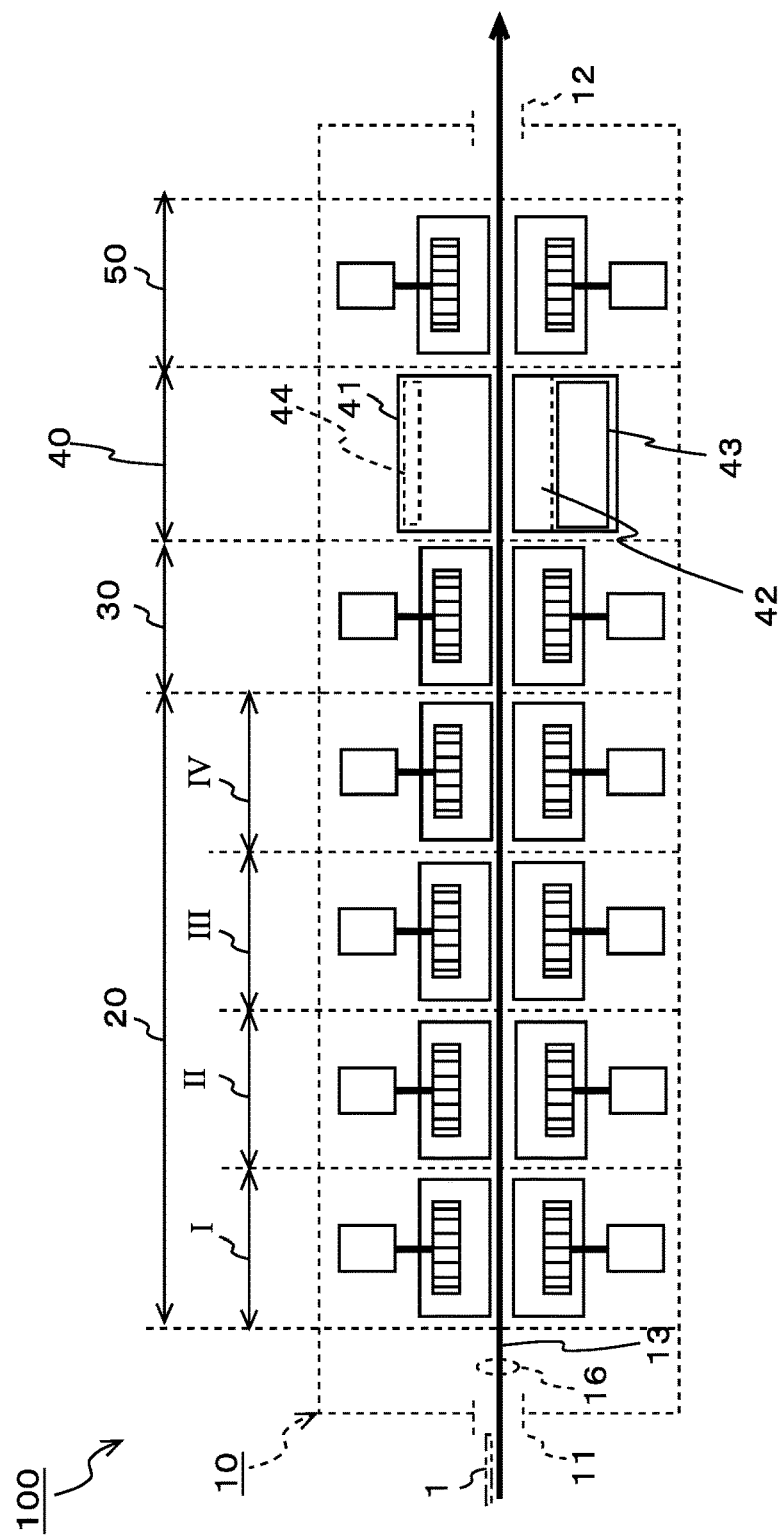
FIG. 1 is a sectional view of a vacuum reflow furnace 100 as an embodiment according to the invention for showing a configuration example thereof.

The following will describe the soldering apparatus and the vacuum-soldering method as embodiments of the invention with reference to the drawings. The vacuum reflow furnace 100 shown in FIG. 1 forms an example of the soldering apparatus. For example, it is configured so as to perform defoaming/deaerating process under vacuum condition when mounting a surface mounting component such as a power device, a power module or the like on a printed circuit board at a predetermined position and soldering the component and the printed circuit board. An object of the soldering is the printed circuit board, solder coated component, other semiconductor wafer and the like. Hereinafter, they will be generically referred to as "work 1".

The vacuum reflow furnace 100 contains a main body 10. The main body 10 constitutes a muffle furnace. For example, the main body 10 has a conveying path 16 at midway thereof. It is divided into a muffle upper portion and a muffle lower portion, both not shown, relative to this conveying path 16. It is provided with a hinge mechanism at its back side and the conveying path 16 can be seen and checked when opening the muffle upper portion.

An inlet 11 is provided on an end of the main body 10 and an outlet 12 is provided on the other end thereof. The conveying portion 13 is provided between the inlet 11 and the outlet 12 on the conveying path 16. In this embodiment, for the conveying portion 13, a walking beam type conveying mechanism 70 (see FIGS. 5 through 8B) is used. This conveying mechanism 70 can feed the work 1 intermittently at a predetermined conveying speed.

A preheating portion 20, a main heating portion 30, a chamber 40 and a cooling portion 50 are arranged in the main body 10 in order from the inlet 11 and the work 1 is conveyed intermittently to pass through them and reach the outlet 12.

The preheating portion 20 and the main heating portion 30 constitute an example of heating portion. The heating portion adopts a hot air circulation heating system. The preheating portion 20 contains four preheating zones I through IV which are configured so as to heat the work 1 gradually (about 150 degrees C. to about 180 degrees C. through about 160 degrees C. and about 170 degrees C.) to reach a predetermined temperature (for example, 260 degrees C.). The preheating zones I through IV are arranged on and below the conveying path 16. The main heating portion 30 as the first heating portion is provided at a position that is adjacent to the preheating portion 20 and is configured to heat the work 1 to around 260 degrees C. before the work 1 enters into the chamber 40.

The chamber 40 is provided at a position that is adjacent to the main heating portion 30. The chamber 40 performs defoaming/deaerating process under vacuum condition when performing the soldering on the work 1. The chamber 40 shown in FIG. 2 contains a container 41, a base 42 and an elevating mechanism 43. It shows a state where the container 41 is away from the base 42 and stops at a predetermined upper position. Hereinafter, the stop position of the container 41 is referred to as "a home position Hp". The home position Hp is a position where the container 41 is positioned above the base 42 by a height "h" from a reference position thereof. The height "h" may be height such that the work 1 is not hindered from being imported from the main heating portion 30 to the base 42.

The container 41 has a housing structure with the bottom being opened. For example, it is arranged so that a case-like body made of stainless steel is upside down to become a cover. An interior of the container 41 is a cavity (space). The container 41 is configured to move vertically by the elevating mechanism 43. Here, when a conveying direction of the work 1 is set to be "x" direction, a direction that is orthogonal to this conveying direction is set to be "y" direction and a direction that is orthogonal to the "x" and "y" directions is set to be "z" direction, the container 41 moves vertically along this "z" direction when performing any vacuum processing.

The base 42 is arranged under the container 41 and the elevating mechanism 43 is arranged under this base 42. In the elevating mechanism 43, a hydraulically-operated cylinder, a pneumatically-operated cylinder or the like is used.

The base 42 has a plane which is broader than an area of the bottom of the container 41 and a predetermined thickness. The base 42 has an airtight seal member 48 at a position that the bottom of the container 41 touches. As the seal member 48 is required to have any heat-resistant properties, fluorine-based packing, for example, is used.

Figure 4:
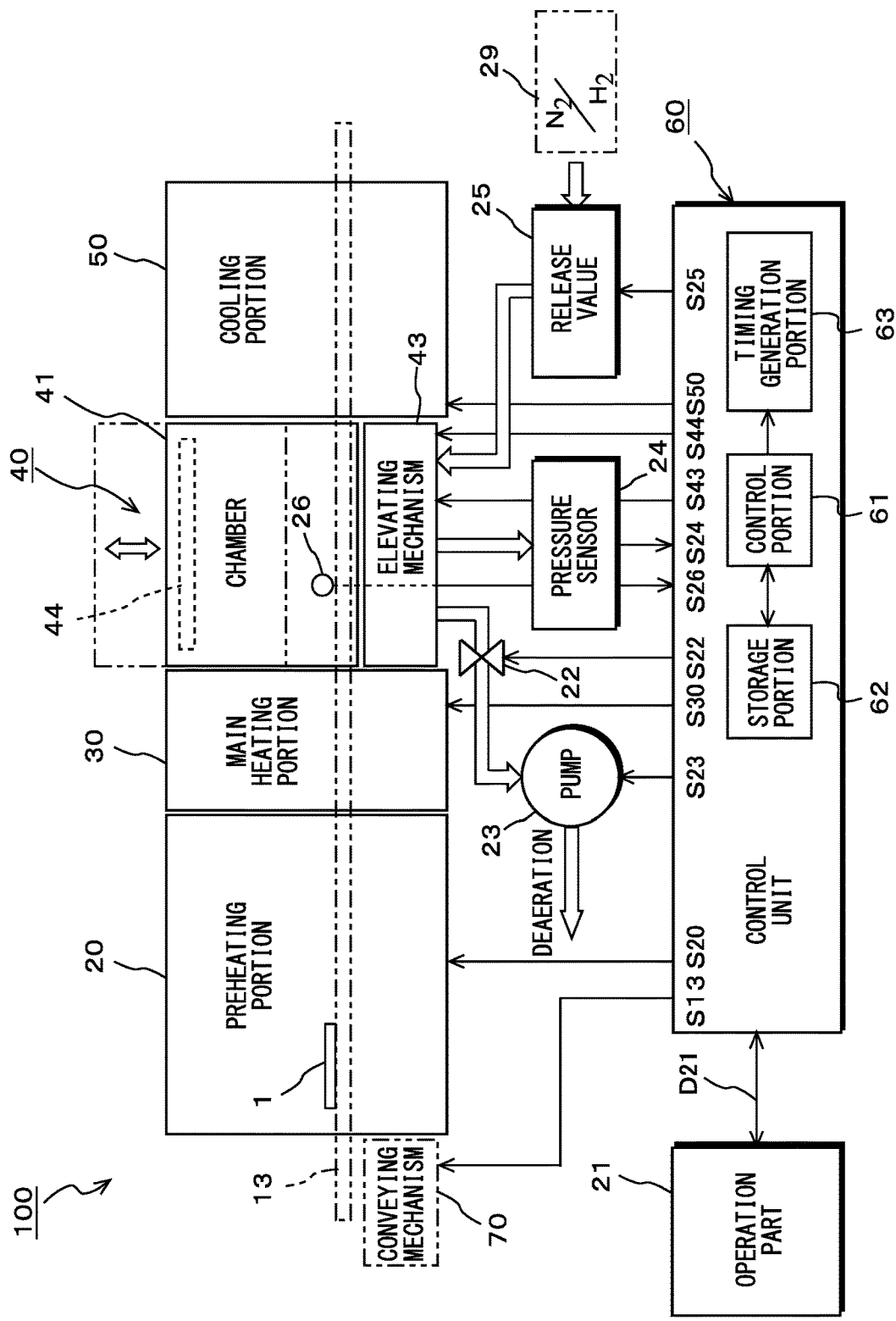
FIG. 4 is a block diagram of a control system in the vacuum reflow furnace 100 for showing a configuration example thereof.

An exhaust port 201 is provided at a center of an upper surface of the base 42. An exhaust pipe, not shown, is arranged inside of the base 42. An end thereof is connected to the exhaust port 201 and the other end thereof is connected to a connection port 202 for exhaust. The connection port 202 is attached to a right or left side surface of the base 42 relative to a conveying direction of the work 1. The connection port 202 is connected to an electromagnetic valve 22 shown in FIG. 4.

A gas-supplying port 203 is also provided at a predetermined position of the upper surface of the base 42. A gas pipe, not shown, is arranged inside of the base 42. An end thereof is connected to the gas-supplying port 203 and the other end thereof is communicated to a connection port 204 for gas supply. The connection port 204 is attached to other side surface of the base 42 which is orthogonal to the side surface of the base 42 including the connection port 202 of the base 42. The connection port 204 is connected to a release valve 25 shown in FIG. 4.

A panel heater 44 is provided at a top surface of the container 41. The panel heater 44 forms an example of the second heating portion and is configured to heat the work 1 and keep it at a predetermined temperature (around 260 degrees C.). This heating is because the predetermined temperature by the main heating portion 30 before the work 1 enters into the chamber 40 is kept after the work 1 enters into the chamber 40. A heating system of the panel heater 44 is a far infrared radiation panel system. The panel heater 44 is not limited to an arrangement of the top surface of the container 41; but it may be arranged on a side of the base 42.

A pair of fixed beams 45, 46 is provided at a predetermined position of each side on the upper surface of the base 42. The fixed beams 45, 46 form the conveying portion 13. For example, the fixed beam 45 is arranged at a left side end of the upper surface of the base 42 and the fixed beam 46 is arranged at a right side end of the upper surface of the base 42. They are configured to support both sides of the work 1 in the chamber 40. The fixed beams 45, 46 are composed of plate-like block members and a plurality of pins 47 each having a cone-shaped head are arranged on the upper surface of each of the plate-like block members. In this embodiment, the pins 47 are grouped four by four and stand in line with a predetermined arrangement pitch. They stand in line with the predetermined arrangement pitch is because the works 1 having plural lengths can be supported by them without hindrance corresponding to any of the works 1.

Figure 3A:
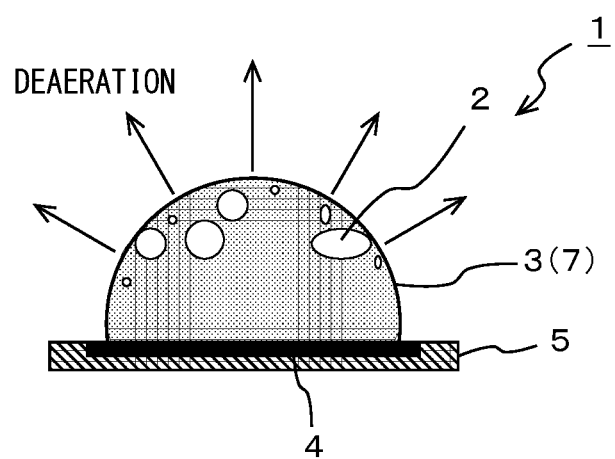
FIG. 3A is a processing diagram of the section of solder 3 for showing an example (Part one) of vacuum deaeration.
Figure 3B:
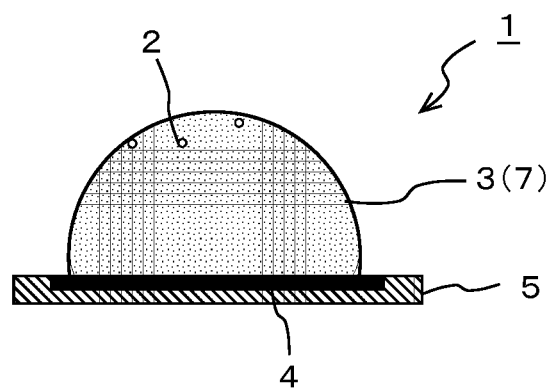
FIG. 3B is a processing diagram of the section of solder 3 for showing the example (Part two) of vacuum deaeration.

Here, the following will describe an example of vacuum deaeration from the solder 3 with reference to FIGS. 3A and 3B. In this embodiment, a case where a pad electrode 4 is formed on a substrate 5 such as a printed circuit board, a semiconductor wafer and the like, particularly, a substrate for power device as the work 1 and the solder 3 is formed on this pad electrode 4 will be described. A size of the substrate 5 is of, for example, about 250 mm by about 300 mm (width by length=250 mm*300 mm) Further, a size of the pad electrode 4 of this example is of about 5 mm by about 5 mm FIG. 3A shows a condition of molten solder 7 in which the solder 3 has not yet solidified. Circular or oval white portions in the drawing are voids 2 which are aggregations of air unexpectedly generated in the molten solder 7. The air in the molten solder 7 comes together in accordance with a drop of vacuum pressure (increase in degree of vacuum) of the chamber 40 so that the voids 2 grow up largely in their shapes.

During the vacuum drawing process, the voids 2 are pulled toward the outside so that a condition in which any pressure difference occurs in a boundary surface between the voids 2 and the solder is generated. The voids 2 come out of the molted solder 7 to the outside (defoamed/deaerated).

The solder 3 shown in FIG. 3B is under the molted condition thereof when the pressure in the container 41 reaches a target pressure. In this invention, a control in which after the previously set target pressure is reached, this target pressure is kept for a predetermined period of time is performed, which will be described later. Thus, the voids 2 in the molten solder reaching the target pressure are gradually defoamed/deaerated by vacuum drawing of a fixed pressure. Accordingly, it is possible to avoid the condition generated in the past such that the voids 2 burst, thereby preventing flux or solder from being scattered. Only the small sized voids remain in the vicinity of an outer surface thereof. In this condition, it is configured that the work 1 is cooled. This enables the solder 3 including less voids 2 to be formed on the pad electrode 4.

Next, the following will describe a control system in the vacuum reflow furnace 100 for showing a configuration example thereof. In order to control the preheating portion 20, the main heating portion 30, the chamber 40, the cooling portion 50 and the conveying mechanism 70, the control system in the vacuum reflow furnace 100 shown in FIG. 4 includes an operation part 21, the electromagnetic valve 22, a pump 23, a pressure sensor 24, the release valve 25, an arrival sensor 26, the elevating mechanism 43, the panel heater 44 and a control unit 60. The control unit 60 has a control portion 61, a storage portion 62, a timing generation portion 63 and the like.

The operation part 21 is connected to the control unit 60 and allows the input(s) of the vacuum pressure in the chamber 40, vacuum pressure keeping time and the like to set the control portion 61. In the operation part 21, a liquid crystal panel, numeric keys and the like are used. A single vacuum pressure or plural vacuum pressures is or are inputted and set by the operation part 21. For example, a first target pressure P1 and a second target pressure P2 when performing the vacuum defoaming/deaerating process are set thereby. The setting of the first target pressure P1 and the second target pressure P2 is because the vacuum soldering is performed by setting the vacuum pressures. The first target pressure P1 and the second target pressure P2 are output to the control portion 61 as the manipulation data D21. Of course, a "start button", not shown, is provided in the operation part 21 and instructs the control portion 61 to start.

The conveying mechanism 70 is provided in the conveying portion 13 and is connected to the control unit 60. A conveying control signal S13 is output to the conveying mechanism 70 from the control unit 60. The conveying control signal S13 is a signal for operating moving beams 18, 28 to feed the work 1 intermittently (see FIGS. 5 through 8).

The preheating portion 20 is connected to the control unit 60. A preheating control signal S20 is output to the preheating portion 20 from the control unit 60. The preheating portion 20 is a signal for controlling the four preheating zones I through IV in order to operate heaters and fans of the preheating portion 20 to heat the work 1 to reach the predetermined temperature (for example, 260 degrees C.).

The main heating portion 30 is connected to the control unit 60. A main heating control signal S30 is output to the main heating portion 30 from the control unit 60. The main heating control signal S30 is a signal for operating heaters and fans of the main heating portion 30 to heat the work 1 to 260 degrees C.

The elevating mechanism 43 is connected to the control unit 60. An elevating control signal S43 is output to the elevating mechanism 43 from the control unit 60. The elevating control signal S43 is a signal for elevate the contain 41.

The panel heater 44 is connected to the control unit 60. A heater control signal S44 is output to the panel heater 44 from the control unit 60. The heater control signal S44 is a signal for keeping the interior of the airtight container 41 at predetermined temperature.

The electromagnetic valve 22 is connected to the control unit 60. As the electromagnetic valve 22, a throttle valve for vacuum control is used. An electromagnetic valve control signal S22 is output to the electromagnetic valve 22 from the control unit 60. The electromagnetic valve control signal S22 is a signal for controlling a valve opening position of the electromagnetic valve 22.

The pump 23 is connected to the control unit 60. As the pump 23, a vacuum pump such as rotary type one (blower), reciprocating type one (piston) or the like is used. A pump control signal S23 is output to the pump 23 from the control unit 60. The pump control signal S23 is a signal for controlling an output of the pump 23.

The arrival sensor 26 is connected to the control unit 60. The arrival sensor 26 generates an arrival detection signal S26 when performing the defoaming/deaerating process. The arrival detection signal S26 is a signal for indicating whether or not the work 1 arrives in the chamber 40 and is output to the control unit 60 from the arrival sensor 26. In the arrival sensor 26, a reflection type optical sensor or a transmission type optical sensor is used.

The pressure sensor 24 is connected to the control unit 60. The pressure sensor 24 constitutes an example of a detection portion and generates a pressure detection signal S24 when performing the defoaming/deaerating process. The pressure detection signal S24 is a signal for indicating pressure in the chamber 40 and is output to the control unit 60 from the pressure sensor 24. In the pressure sensor 24, a diaphragm vacuum gage, a thermocouple vacuum gage, a Pirani vacuum gage, a Penning vacuum gage or the like is used.

Figure 2:
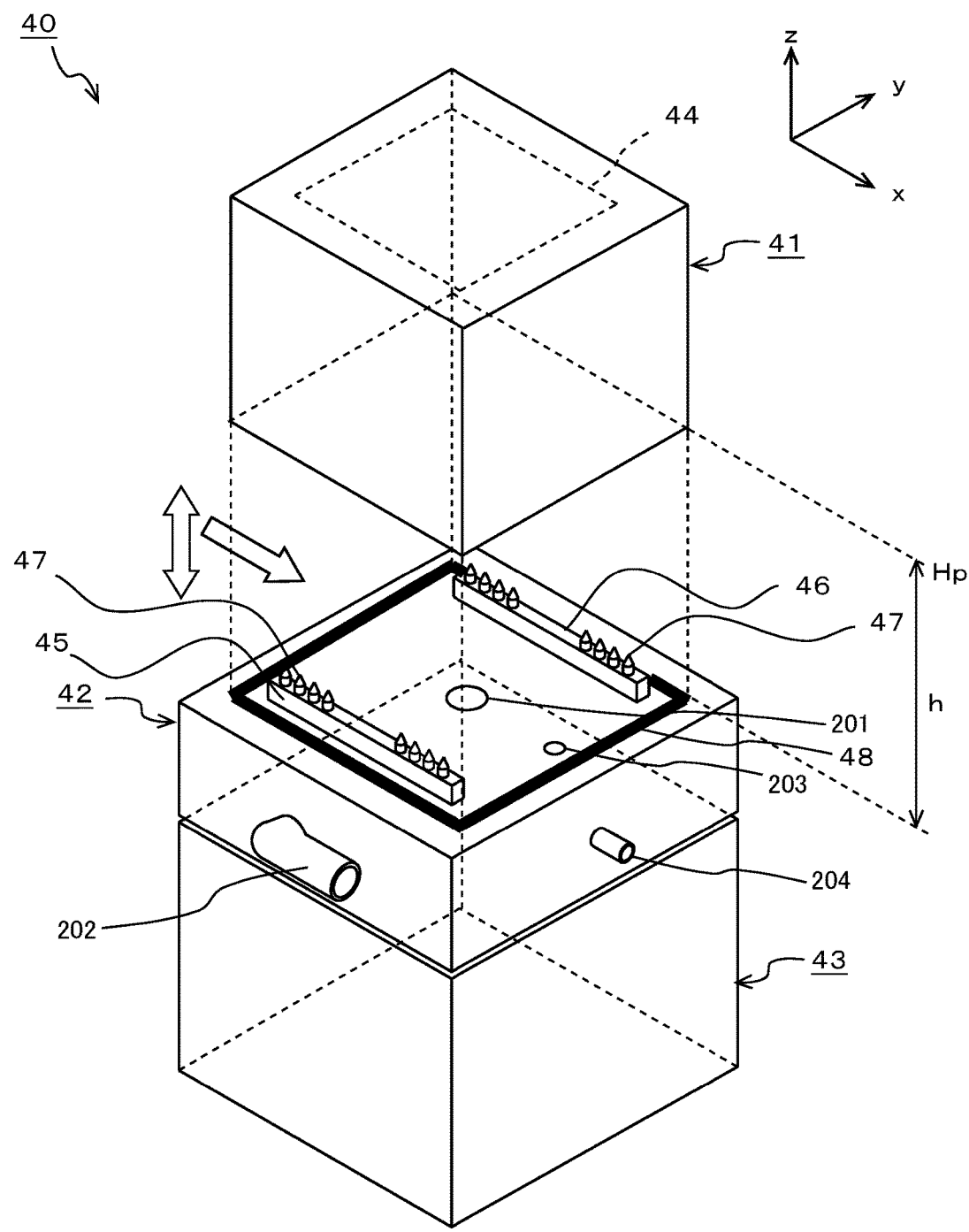
FIG. 2 is a perspective view of a chamber 40 for showing the configuration example thereof.

An end of the release valve 25 is connected to the connection port 204 of the base 42 shown in FIG. 2 and the other end thereof is connected to a gas supplying portion 29 such as a nitrogen ($N_2$) gas cylinder, not shown, a hydrogen ($H_2$) cylinder, not shown, or the like. The gas supplying portion 29 has a proportional electromagnetic valve, not shown. The gas supplying portion 29 may supply at least any one of $N_2$ gas (inert gas) and $H_2$ gas (active gas for deoxidization) into the chamber 40. The proportional electromagnetic valve is configured to adjust an amount of flowing $N_2$ or $H_2$ gas. A release valve control signal S25 is output to the release valve 25 from the control unit 60. The release valve control signal S25 is a signal for controlling the release valve 25.

As the release valve 25, a member having an initial release valve and a main release valve is used. The initial release valve has a predetermined diameter which is smaller than that of the main release valve. The initial release valve is used for making an amount of flowing gas to the chamber 40 smaller or for preceding operation of the main release valve. The main release valve has a diameter which is larger than that of the initial release valve so that a larger amount of flowing gas can be passed than that passing through the initial release valve. By controlling the release valve 25, it is possible to adjust the interior of the chamber 40 to multistage target pressures (Pa) during vacuum pressure reduce procedure.

The cooling portion 50 is connected to the control unit 60. A cooling control signal S50 is output to the cooling portion 50 from the control unit 60. The cooling control signal S50 is a signal for controlling a heat exchanger, fans and the like. A cooling system of the cooling portion 50 includes turbo fans (in nitrogen atmosphere).

The control unit 60 has the control portion 61, the storage portion 62 and the timing generation portion 63. The control unit 60 is also provided with analog/digital converter, not shown, an oscillator, not shown, and the like. The storage portion 62 is connected to the control portion 61 and stores control data D62. The control data D62 is data for controlling the preheating portion 20, the electromagnetic valve 22, the pump 23, the release valve 25, the main heating portion 30, the elevating mechanism 43, the panel heater 44, the cooling portion 50 and the conveying mechanism 70. As the storage portion 62, read only memory (ROM), random access memory (RAM), hard disk drive (HDD) and the like are used.

The control portion 61 controls the electromagnetic valve 22, the pump 23 and the release valve 25 to adjust vacuum pressure based on the pressure detection signal S24 and to keep the vacuum pressure for a predetermined period of time. As the control portion 61, a central processing unit (CPU) is used.

For example, when keeping the set vacuum pressure for a predetermined period of time, the control portion 61 controls the pump 23 to maintain its predetermined number of revolution based on the pressure detection signal S24 and to regulate an amount of flowing gas to the chamber 40 so that a set vacuum pressure can be kept for a predetermined period of time. In this moment, the control portion 61 controls the release valve 25 to adjust the amount of flowing gas. This is because the interior of the chamber 40 is kept to have a set vacuum pressure for a predetermined period of time. Such a control enables the interior of the chamber 40 to be kept at the specified vacuum pressure. Thus, the voids 2 in the molten solder 7 are gradually deaerated or defoamed. Accordingly, it is possible to avoid any condition such that the voids 2 burst, thereby preventing flux or solder from being scattered.

Further, when keeping the set vacuum pressure for a predetermined period of time, the control portion 61 controls an amount of flowing gas to the chamber 40 to be constant based on the pressure detection signal S24 and controls numbers of revolution of the pump 23 so that a set vacuum pressure can be kept for a predetermined period of time. Such a control also enables the interior of the chamber 40 to be kept at the specified vacuum pressure. Thus, the voids 2 in the molten solder 7 are gradually deaerated/defoamed. Accordingly, it is possible to perform vacuum soldering by which the voids 2 decrease.

The timing generation portion 63, other than the storage portion 62, is connected to the control portion 61. The timing generation portion 63 receives a reference clock signal from the oscillator, not shown and a control command from the control portion 61. The timing generation portion 63 also generates the above-mentioned preheating control signal S20, the electromagnetic valve control signal S22, the release valve control signal S25, the main heating control signal S30, the elevating control signal S43, the heater control signal S44, the cooling control signal S50 and the conveying control signal S13.

Figure 5:
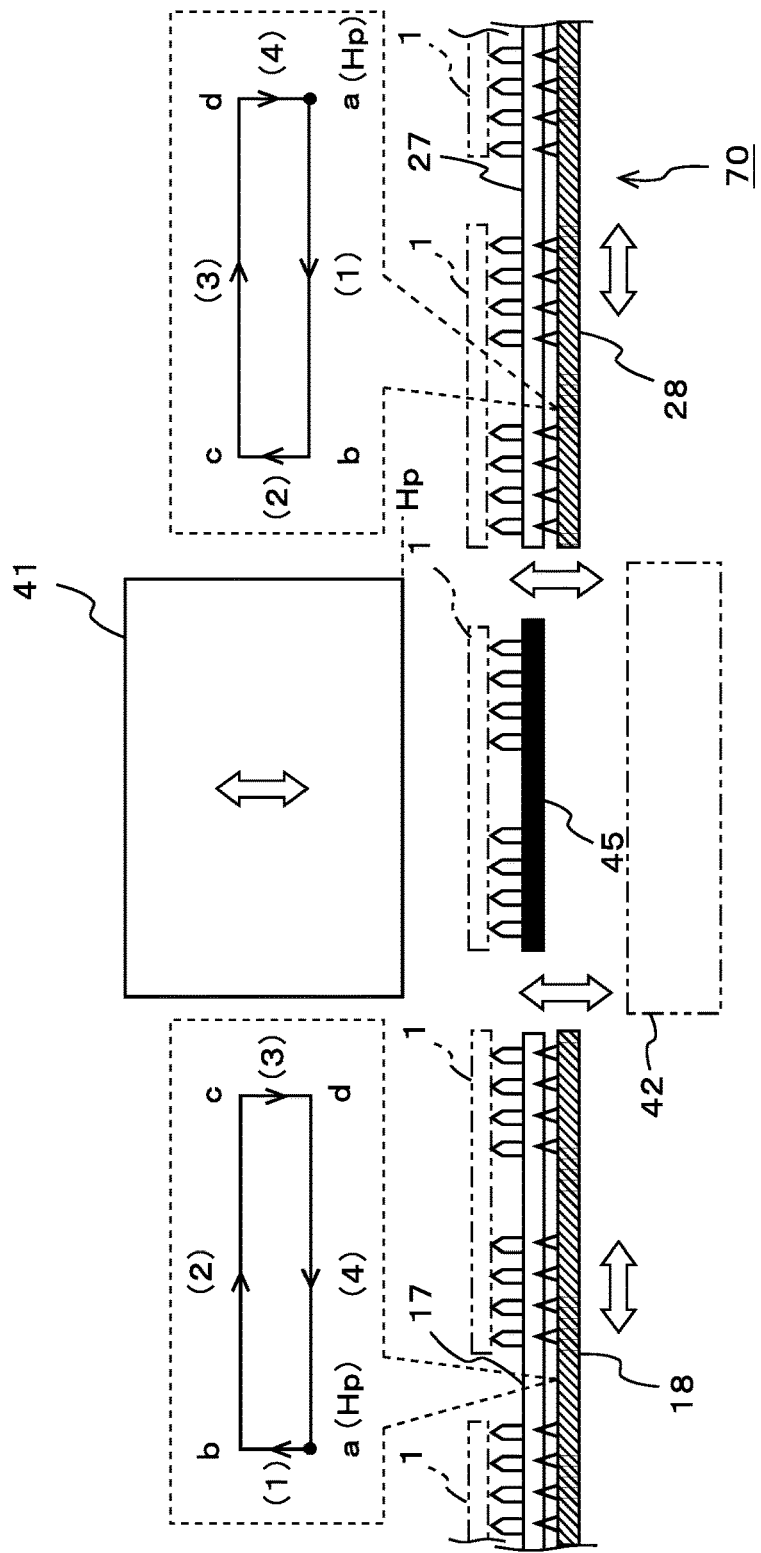
FIG. 5 is a sectional view of a conveying portion 13 for showing a configuration example thereof.

Next, the following describe a configuration example of the conveying mechanism 70, a conveying example of the work 1 (Parts one through six) and a control example of the chamber 40, with reference to FIGS. 5 through 9. In FIG. 5, the walking beam type conveying mechanism 70 has fixed beams 17, 27 and moving beams 18, 28. A feeding pitch of each of the moving beams 18, 28 are of, for example, about 400 mm Here, with reference to the chamber 40, a side from which the work 1 is imported is set to be an import side and a side from which the work 1 is exported is set to be an export side. The fixed beams 17 of the import side are provided on the preheating portion 20 and the main heating portion 30 and the fixed beams 27 of the export side are provided on the cooling portion 50.

A pair of the fixed beams 17 and a pair of the fixed beams 27 are provided on opposite sides of the conveying path 16 of the work 1. The moving beams 18, 28 are respectively operated to move up and below and right and left (walk) to the fixed beams 17, 27 of both sides (see (1)-(4) in the drawing). In the drawing, a code "a" indicates a home position of each of the moving beams 18, 28. The moving beams 18, 28 are respectively configured to be independently driven on the import and export sides.

For example, the moving beam 18 of the import side elevates vertically (from "a" to "b") on a path (1) and receives the work 1 from the fixed beam 17 (fixed beam 45). Next, it moves horizontally (from "b" to "c") on a path (2) with mounting the work 1. It then descends vertically (from "c" to "d") on a path (3). The moving beam 18 moves horizontally (from "d" to "a") on a path (4) after the work 1 is mounted on the fixed beam 17 (fixed beam 45) and returns to the home position Hp. Thus, the work 1 is intermittently fed step by step.

Further, the moving beam 28 of the export side moves horizontally (from "a" to "b") on a path (1). Next, it elevates vertically (from "b" to "c") on a path (2). Accordingly, the moving beam 28 receives the work 1 from the fixed beam 45 (fixed beam 27). It also moves horizontally (from "c" to "d") on a path (3) with mounting the work 1. It then descends vertically (from "d" to "a") on a path (4) and after the work 1 is mounted on the fixed beam 27, it returns to the home position Hp. Thus, the work 1 is intermittently fed step by step at a predetermined conveying speed (the work 1 is conveyed one by one from right side to left side on page space).

[Operation when Exporting Work]

The work 1 is mounted on the fixed beams 45 shown in FIG. 5 (46: see FIG. 2) and the container 41 stops at a position at which it does not hinder the conveying portion 13 from conveying the work. This position is set to be a home position Hp of the chamber 40 and here, the container 41 waits. Assuming these operations, when exporting the work 1 mounted on the fixed beam 45 as shown in FIG. 5 from the chamber 40, in FIG. 6A, the moving beam 28 moves horizontally (from "a" to "b") on the path (1) and it then elevates vertically (from "b" to "c") on the path (2) and receives the work 1 from the fixed beam 45 on the base 42. In this moment, the moving beam 28 lifts the work 1 from a downward of the fixed beam 45 and receives it.

Figure 6A:
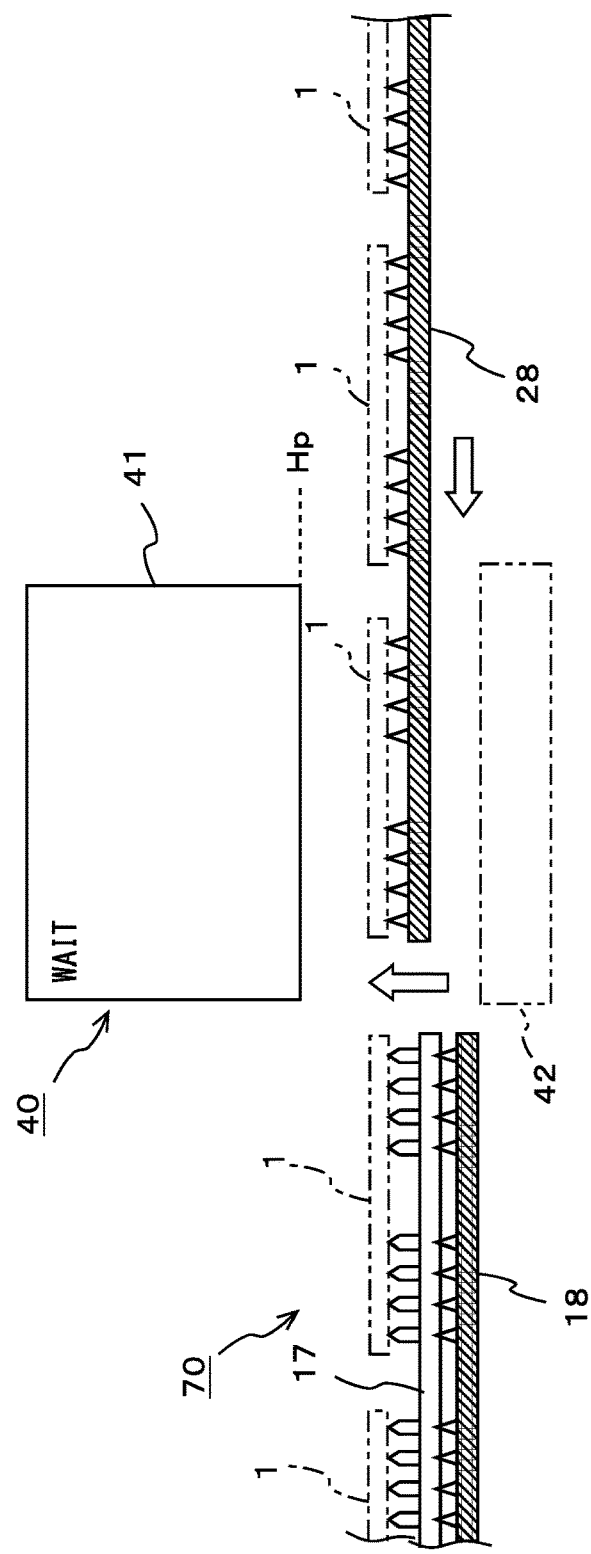
FIG. 6A is a sectional view for showing a conveying example (Part one) of a work 1.
Figure 6B:
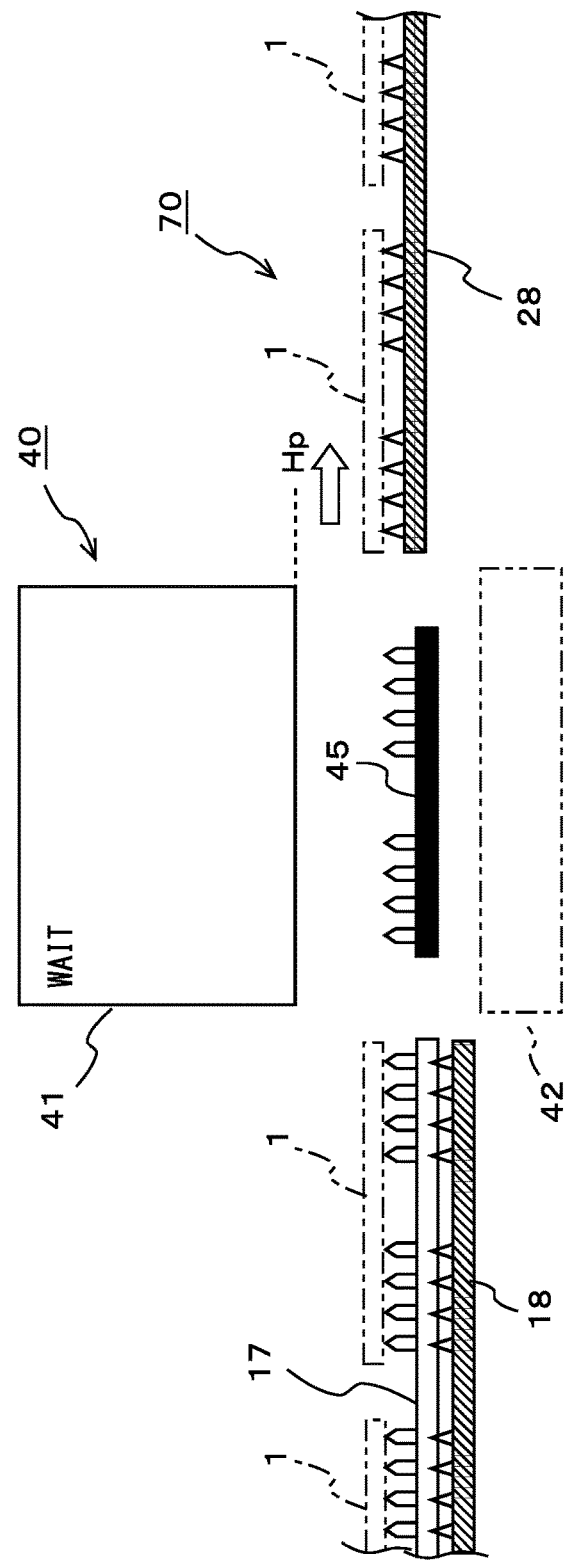
FIG. 6B is a sectional view for showing the conveying example (Part two) of the work 1.

Thereafter, in FIG. 6B, the moving beam 28 also moves horizontally (from "c" to "d") on the path (3) with lifting up the work 1 and then, it descends vertically (from "d" to "a") on the path (4). Thus, the work 1 received from the chamber 40 can be transferred to the cooling portion 50. The moving beam 28 then waits at the home position Hp=a of the export side.

[Operation when Importing Work]

Figure 7A:
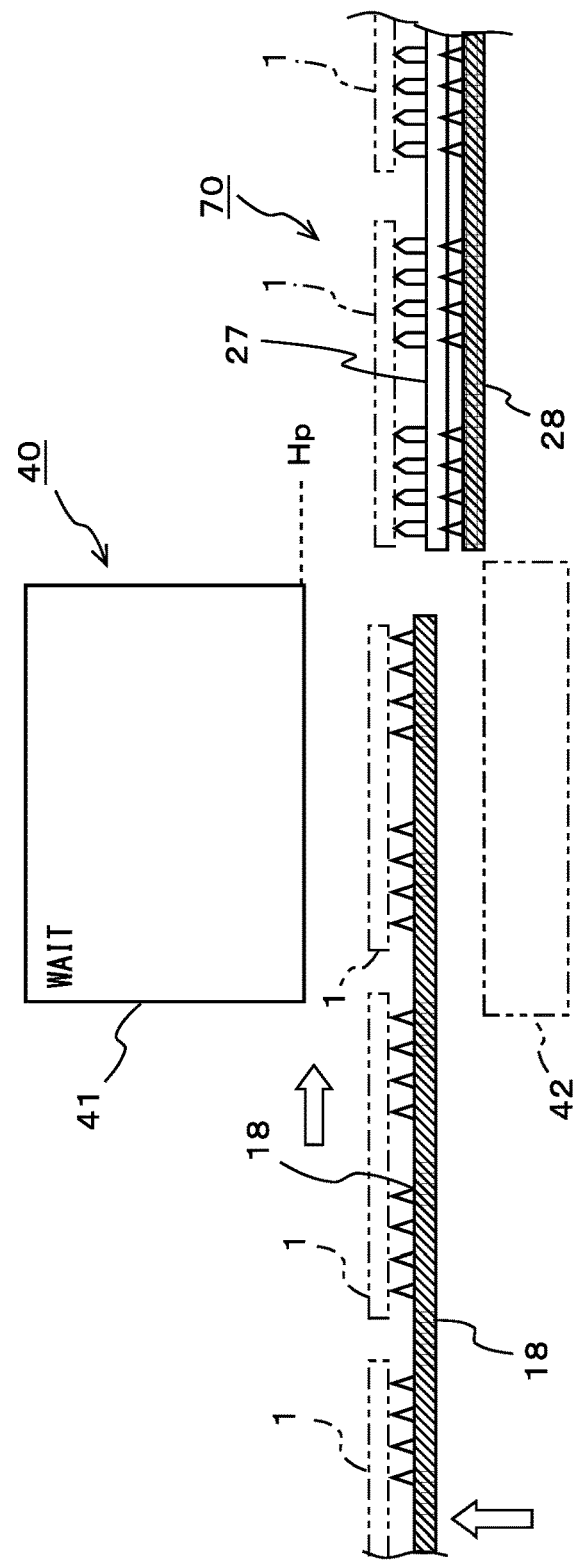
FIG. 7A is a sectional view for showing the conveying example (Part three) of the work 1.

Moreover, in FIG. 7A, at the import side, the moving beam 18 elevates vertically (from "a" to "b") on the path (1) and receives the work 1 from the fixed beam 17 of the main heating portion 30 by elevating the moving beam 18. The moving beam 18 then moves horizontally (from "b" to "c") on the path (2) and descends vertically (from "c" to "d") on the path (3). The work 1 is mounted on the fixed beam 45 on the base 42 by descending the moving beam 18.

Figure 7B:
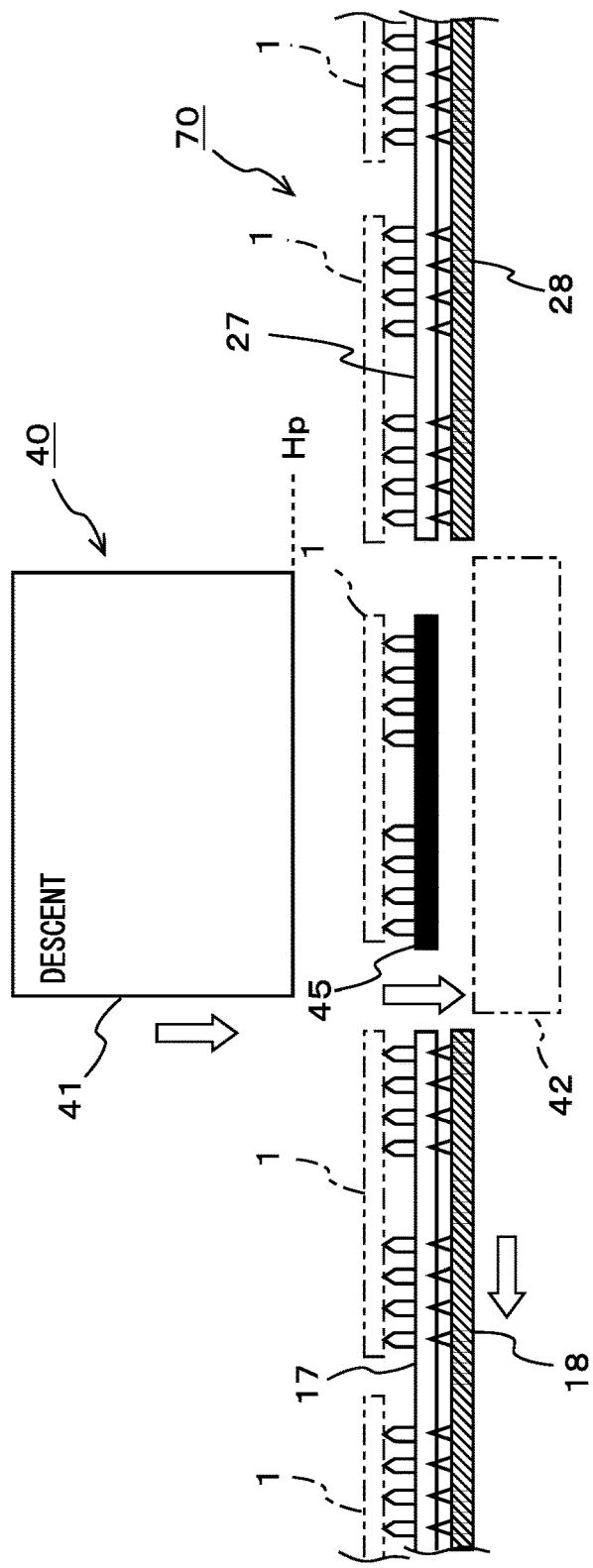
FIG. 7B is a sectional view for showing the conveying example (Part four) of the work 1.

Thereafter, in FIG. 7B, the moving beam 18 moves horizontally (from "d" to "a") on the path (4) and returns to the home position Hp=a of the import side. Thus, the moving beam 18 waits at the import side of the chamber 40 and the process is shifted to the import of the next work 1 (intermittent feeding).

Figure 8A:
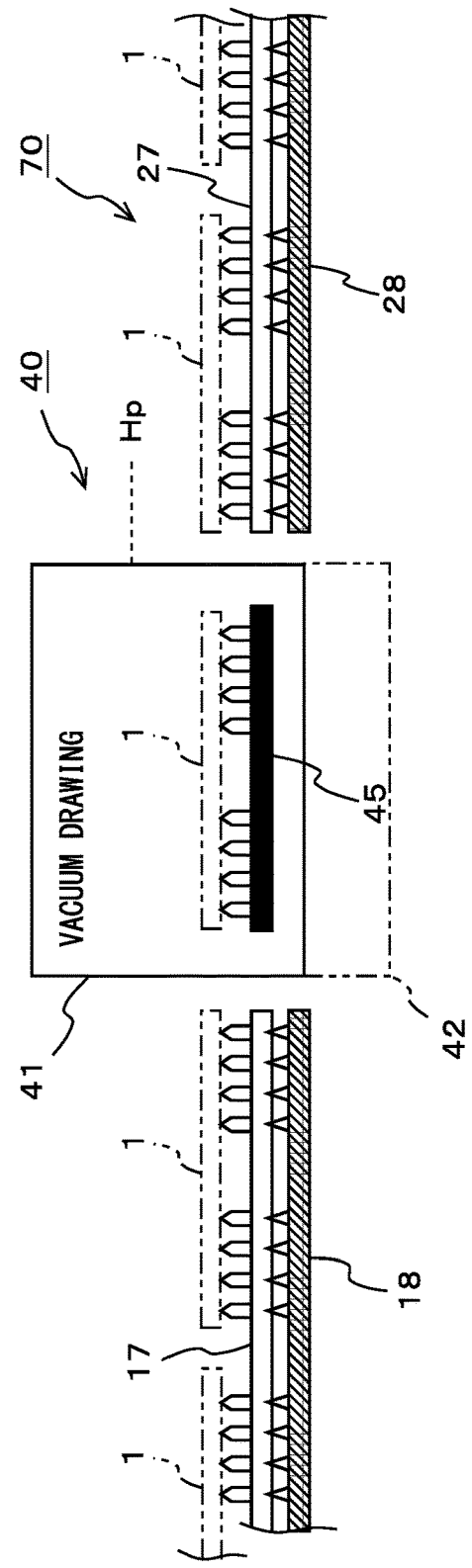
FIG. 8A is a sectional view for showing the conveying example (Part five) of the work 1.

On the other hand, in FIG. 8A, when moving the moving beam 18 away from the chamber 40, the elevating mechanism 43 operates in the chamber 40 to descend the container 41 from its home position Hp. When the descent by the elevating mechanism 43, not shown, is complete, the container 41 becomes in a state of holding the base 42 down. In this moment, the bottom end of the container 41 shown in FIG. 2 contacts the seal member 48. This enables the interior of the container 41 to be in a closed state. A vacuum drawing is then performed on the chamber 40.

[Operation when Forming Closed State]

Figure 9:
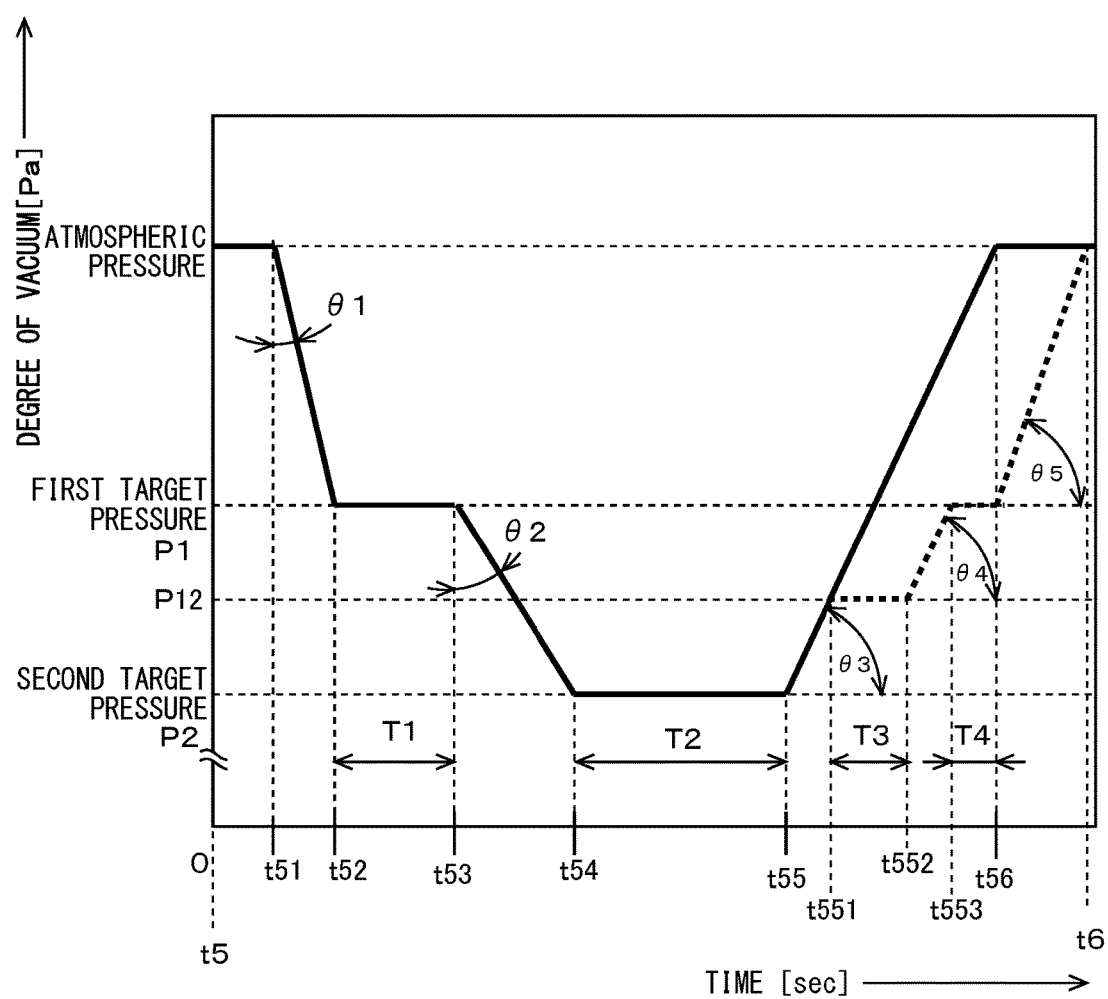
FIG. 9 is a graph for showing a control example of the chamber 40.

After the interior of the container 41 becomes in the closed space, any vacuum drawing is performed by the pump 23. Here, a control example of the chamber 40 will be described with reference to FIG. 9. In this example, a case where first and second target pressures P1, P2 are set and the vacuum drawing is performed on the chamber 40 is illustrated. In FIG. 9, a vertical axis indicates vacuum pressure (pressure) [Pa] in the container 41 and a horizontal axis indicates time concerning vacuum defoaming/deaerating process but a period of time from a point of time t5 to a point of time t6 is extracted from a series of operation time in the vacuum reflow processing. A line graph shown by a bold line in the drawing shows a curve of vacuum pressure control properties (vacuum pressure control curve) in the chamber 40.

In this example, the first target pressure P1 is set and the vacuum drawing (decompression) is performed on the interior of the container 41 shown in FIG. 2 from the atmospheric pressure (about 100,000 Pa) to the first target pressure P1 after a point of time t51 to a point of time t52. P1 is of, for example, 50,000 Pa. The point of time t51 is a start time of decompression and the point of time t52 is a point of time when the first target pressure P1 is attained. Thereafter, the vacuum pressure in the container 41 is kept at the first target pressure P1 from the point of time t52 to a point of time t53. T1 in the drawing indicates first vacuum pressure keeping time (a period of time: set decompression time) and is time which subtracts the point of time t52 from the point of time t53.

The vacuum pressure keeping time T1 is, for example, about 10 seconds (T1=10 (sec)) when a period of time from a start of decompression to vacuum break is set to be 60 seconds. Further, the second target pressure P2 is set and the vacuum drawing (decompression) is performed on the interior of the container 41 down to the second target pressure P2 from the point of time t53 to a point of time t54. P2 is of, for example, 1,000 Pa. The point of time t53 is a reopen time of decompression and the point of time t54 is a point of time when the second target pressure P2 is attained. Thereafter, the vacuum pressure in the container 41 is kept at the second target pressure P2 from the point of time t54 to a point of time t55.

T2 in the drawing indicates second vacuum pressure keeping time (set decompression time) and is time which subtracts the point of time t54 from the point of time t55. The vacuum pressure keeping time T2 is, for example, about 15 seconds (T2=15 (sec)). Additionally, at a point of time t55, it starts breaking a vacuum state in the container 41 and the interior of the container 41 returns to the atmospheric pressure from the point of time t55 to a point of time t56. The point of time t55 is vacuum break time and the point of time t56 is a point of time when the vacuum break is complete.

Thus, it is possible to set optional vacuum pressure keeping time T1 or T2 in the decompression during a period of set time and perform multistage decompression on the chamber 40 by adjusting its vacuum pressure so to be first and second target pressures P1, P2.

It is also to be noted that the control to keep the set vacuum pressure for a predetermined period of time according to this invention may be also carried out in a process to return from the vacuum break to the atmospheric pressure. For example, when the pressure is increased from the second target pressure P2 to the first target pressure P1 at the vacuum break time, an intermediate pressure P12 may be set. For example, the intermediate pressure P12 is set at a point of time T551 and the intermediate pressure P12 is kept to a point of time t552. Time which subtracts the point of time t551 from the point of time t552 becomes vacuum pressure keeping time T3 in the vacuum break time. Thereafter, at the point of time t552, the first target pressure P1 is again set and the first target pressure P1 is kept at a point of time t553. Vacuum pressure keeping time of the first target pressure Pl in the vacuum break time is indicated by T4. The vacuum pressure keeping time T4 is time which subtracts a point of time t553 from a point of time t56. Since the vacuum pressure keeping time T4 elapses, namely, from the point of time t56 to the point of time t6, the interior of the container 41 may be returned to the atmospheric pressure.

Thus, it is also possible to set the multistage target pressures P12, P1 and the like to be increased in pressure in the vacuum break time. Therefore, in both of vacuum forming time and the vacuum break time, it is possible to solder the work 1 with vacuum deaeration at desired temperature and target vacuum pressures. Such decompression and increase on pressure by stage prevents flux or solder from being scattered.

[Operation when Releasing Closed State]

Figure 8B:
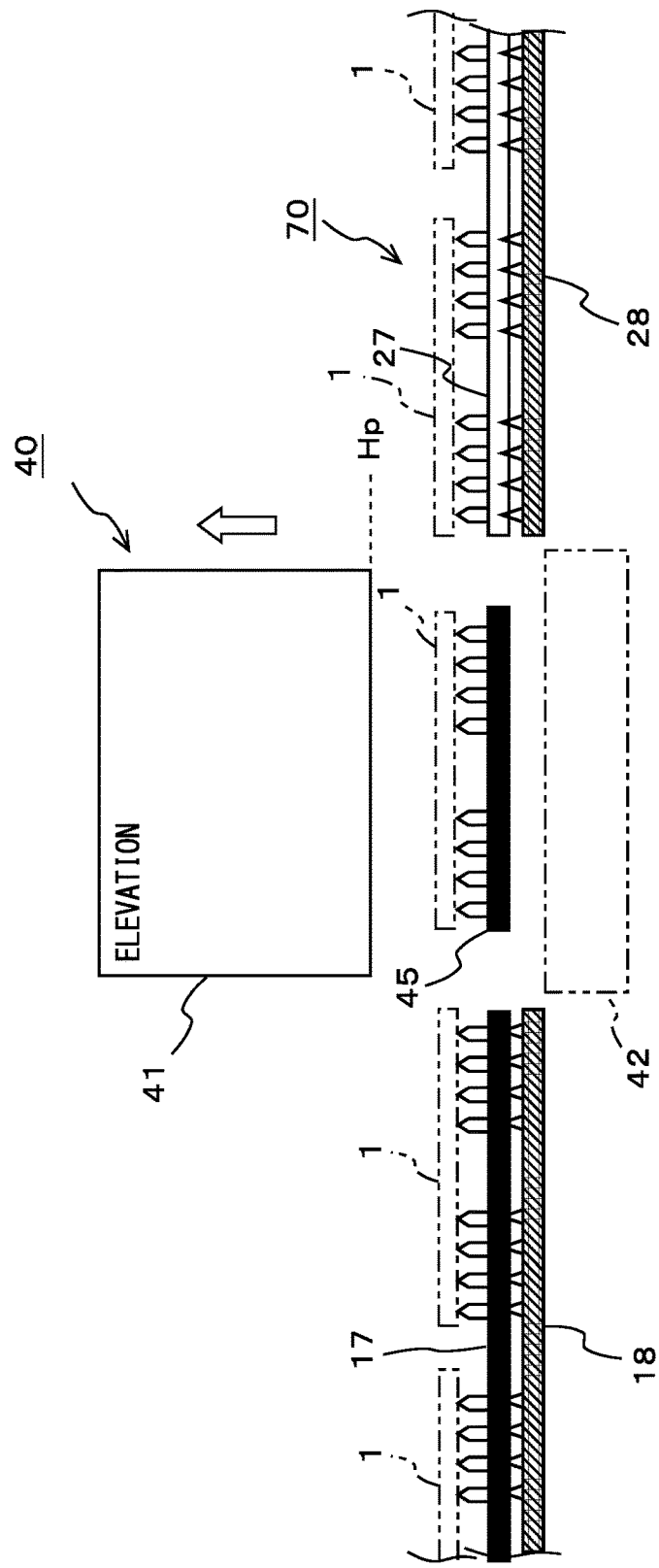
FIG. 8B is a sectional view for showing the conveying example (Part six) of the work 1.

When the vacuum defoaming/deaerating process is complete, the elevating mechanism 43 operates to move the container 41 away from the base 42 shown in FIG. 8A. In this moment, the bottom end of the container 41 held down to the base 42 separates from the seal member 48. When the container 41 is moved away from the base 42 as shown in FIG. 8B, the interior of the container 41 becomes open space. Accordingly, a vacuum soldering system constituting the vacuum reflow furnace 100 and enabling a period of time for keeping the target pressures P1, P2, P12 and the like in their respective stages to be set and enabling the vacuum pressure keeping time to be adjusted can be built.

Figure 10:
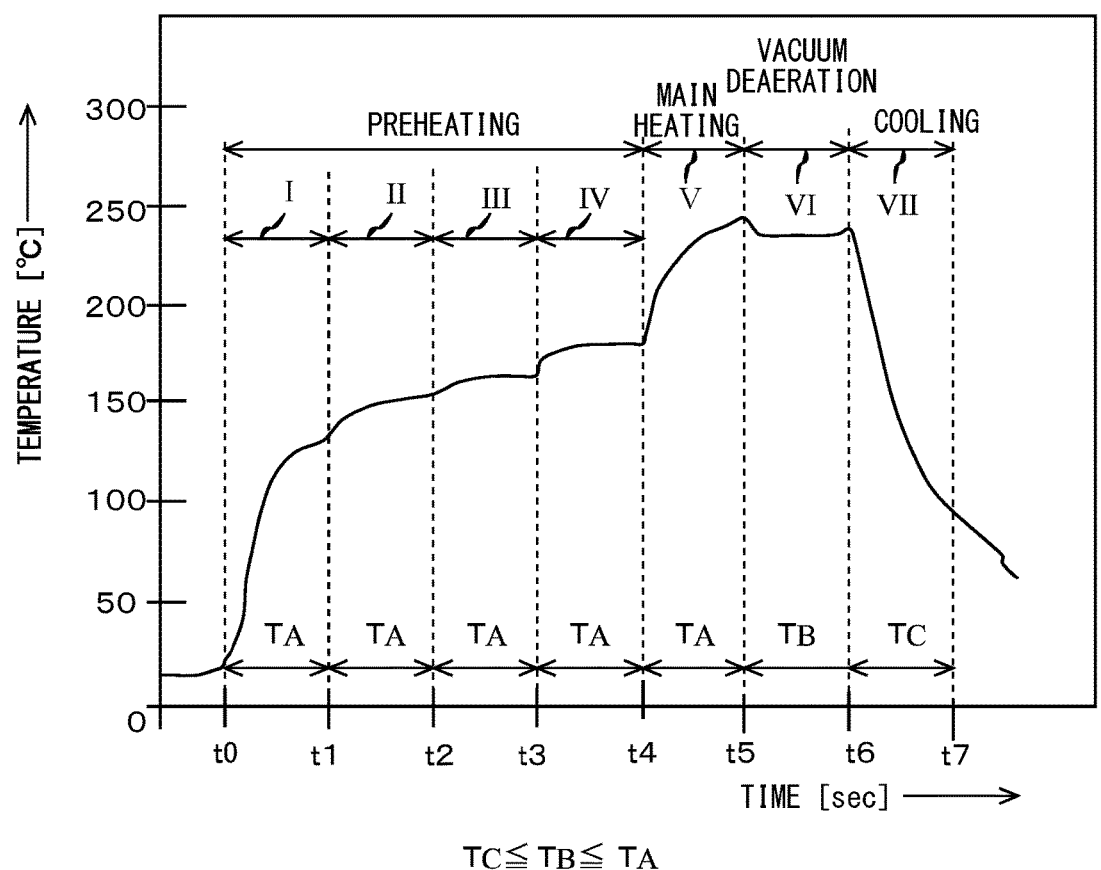
FIG. 10 is a graph for showing a temperature profile of the vacuum reflow furnace 100.
Figure 11:
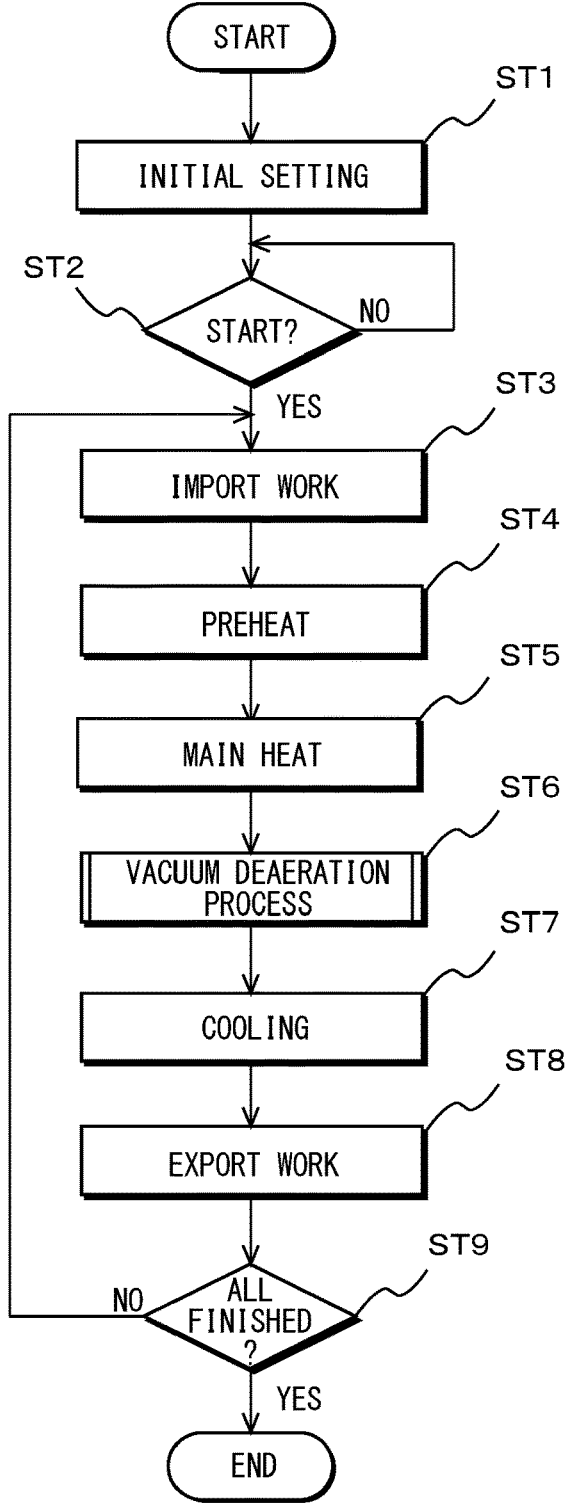
FIG. 11 is a flow chart for showing a control example (Part one) of the vacuum reflow furnace 100.
Figure 12:
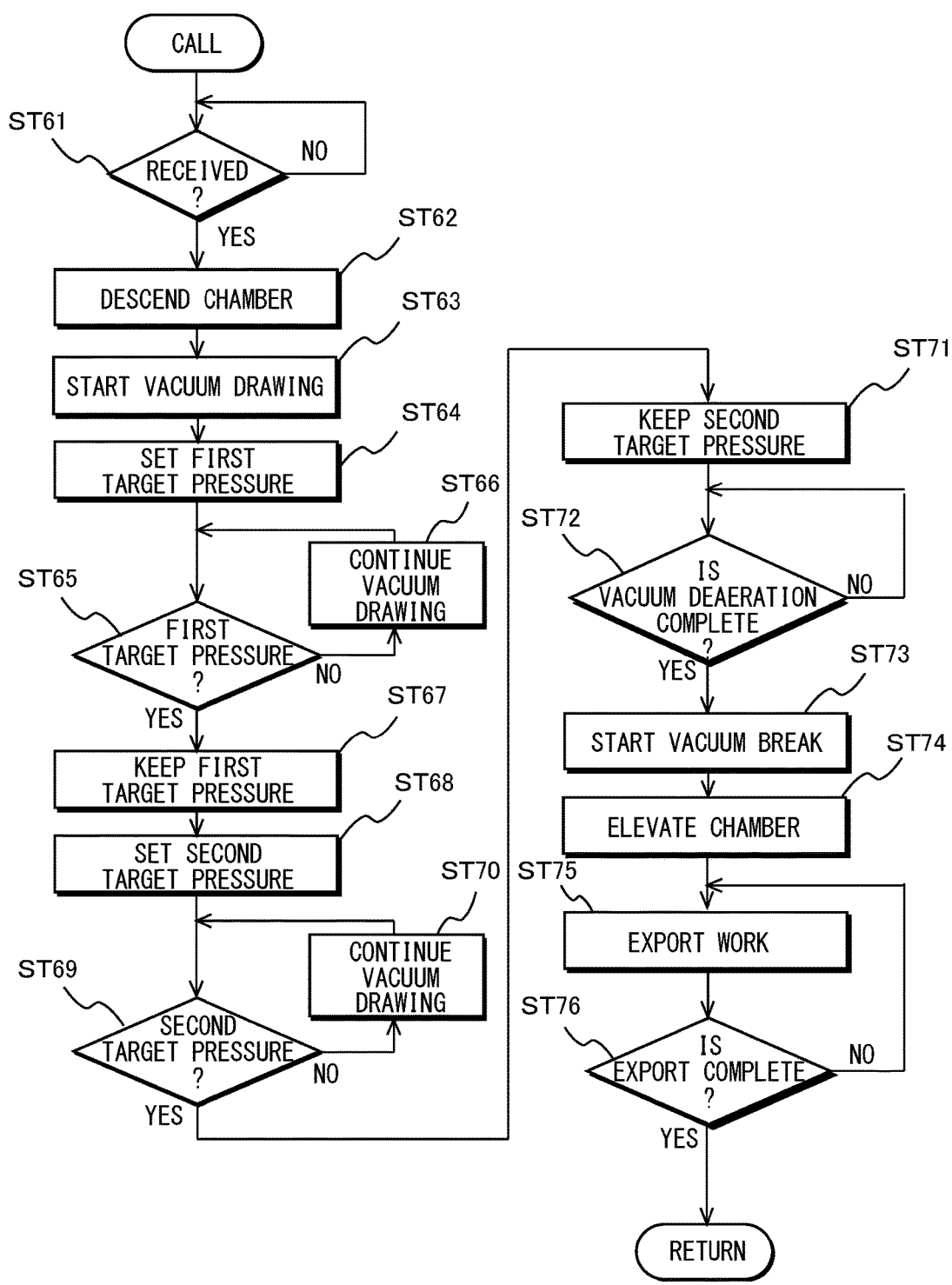
FIG. 12 is a flow chart for showing the control example (Part two) of the vacuum reflow furnace 100.
Figure 13A:
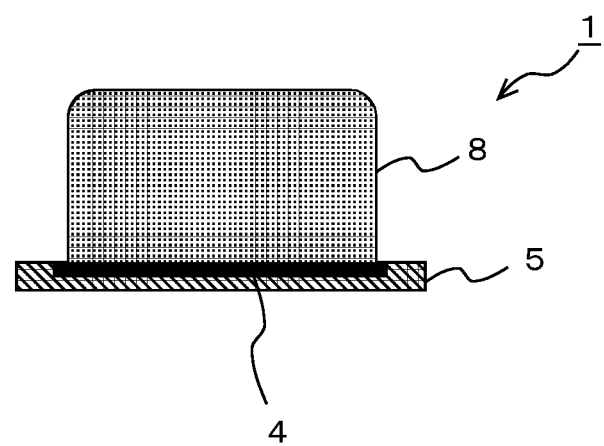
FIG. 13A is a processing diagram for showing a hot blast reflow processing (Part one) according to a past example.
Figure 13B:
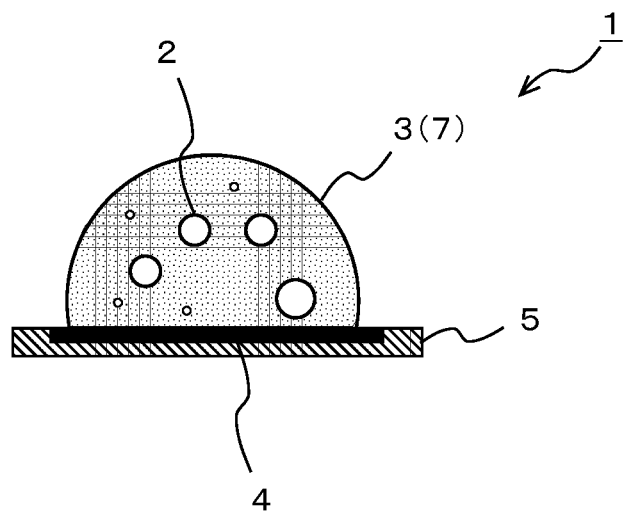
FIG. 13B is a processing diagram for showing the hot blast reflow processing (Part two) according to the past example.

The following will describe the above-mentioned intermittent feeding of the work 1 and a control example of the vacuum reflow furnace 100, relative to a vacuum-soldering method according to the invention, with reference to FIGS. 10 through 12. FIG. 10 shows a temperature profile of the vacuum reflow furnace 100. In FIG. 10, a vertical axis indicates temperature (degrees C.) in the preheating zones I through IV, the main heating zone V, the vacuum deaeration zone VI and the cooling zone VII. A horizontal axis indicates points of elapsed time t1 through t6 (sec). A bold curve in the drawing shows furnace temperature property in the vacuum reflow furnace 100.

Flowcharts shown in FIGS. 11 and 12 show a control example with reference to the work 1. Processing of other works 1 also advance at the same time on the import and export sides of the chamber 40 but the following description will be done paying an attention to an operation of one work 1 around the chamber 40 in order to make the description more easily.

According to the vacuum-soldering method of this embodiment, the following control conditions are set in a case where the work 1 is soldered under vacuum condition.

(i) By the operation part 21, plural vacuum pressures (target pressures P1, P2 and the like), set periods of time (vacuum pressure keeping time Ti, T2 and the like) for keeping the respective vacuum pressures are set.

(ii) The work 1 is heated up to a predetermined temperature before the work 1 enters into the chamber 40.

(iii) When the work 1 enters into the chamber 40, the predetermined temperature of the work 1 before the work 1 enters into the chamber 40 is kept.

As they are the control conditions of a vacuum soldering process, the control portion 61 performs an initial setting at a step ST1 shown in FIG. 11. In this initial setting, using the operation part 21, values of the vacuum pressure in the chamber 40 are input into the control portion 61 which sets the first and second target pressures P1, P2. It also sets the vacuum pressure keeping time T1, T2. The setting of the vacuum pressure in the chamber 40 is not limited to two of the first and second target pressures P1, P2; Single target pressure or plural target pressures may be set. The first and second target pressures P1, P2 and the like are output to the control portion 61 as the manipulation data D21.

At a step ST2, the control portion 61 waits to start. An instruction of the start is made by pushing a start button provided on the operation part 21 or the like by a user. When instructing the start at the step ST2, the control portion 61 goes to a step ST3 where the control portion 61 carries out driving control of the conveying mechanism 70. In this moment, the conveying mechanism 70 receives the conveying control signal S13 from the control unit 60 and moves the moving beams 18, 28 based on the conveying control signal S13 to intermittently feed the work 1 (see FIGS. 6A through 8B).

At a step ST4, the control portion 61 performs preheating on the work 1. In this moment, the preheating portion 20 receives the preheating control signal S20 from the control unit 60 to operate four preheating zones I through IV based on the preheating control signal S20, thereby heating the work 1 gradually (about 150 degrees C. to about 180 degrees C. through about 160 degrees C. and about 170 degrees C.) to reach a predetermined temperature (for example, 260 degrees C.).

For example, in the preheating zone I, the furnace is heated from a normal temperature to around 130 degrees C. during the point of time t0 to the point of time t1 based on the temperature profile shown in FIG. 10. In the preheating zone II, the furnace is heated from 130 degrees C. to around 160 degrees C. during the point of time t1 to the point of time t2. In the preheating zone III, the furnace is heated to around 160 degrees C. through around 170 degrees C. during the point of time t2 to the point of time t3. In the preheating zone IV, the furnace is heated from around 170 degrees C. through around 180 degrees C. during the point of time t3 to the point of time t4.

At a step ST5, the control portion 61 performs main heating on the work 1. In this moment, the main heating portion 30 receives the main heating control signal S30 from the control unit 60 to operate heaters, fans and the like of the main heating portion 30 based on the main heating control signal S30, thereby heating the work 1 to 260 degrees C. According to the temperature profile shown in FIG. 10, in the main heating zone V, the furnace is heated to around 180 degrees C. through around 240 degrees C. during the point of time t4 to the point of time t5.

At a step ST6, the control portion 61 performs vacuum defoaming/deaerating process on the work 1. In this moment, the arrival sensor 26 detects an arrival of the work 1 into the chamber 40 and outputs the arrival detection signal S26 to the control unit 60 when the work 1 is imported by the conveying mechanism 70 onto the base 42 (see FIG. 7B).

According to the vacuum defoaming/deaerating process of this example, the process goes to a subroutine shown in FIG. 12 and at a step ST61, the control portion 61 determines whether or not the work 1 is received on the base 42. In this moment, the control portion 61 receives the arrival detection signal S26 from the arrival sensor 26 to determine whether or not the work 1 is arrived. If not obtaining the arrival detection signal S26 indicating the arrival of the work 1, the control portion 61 waits as it is.

If obtaining the arrival detection signal S26 indicating the arrival of the work 1, the control portion 61 goes to a step ST62 where the control portion 61 performs descendent control on the chamber 40. The elevating mechanism 43 receives the elevating control signal S43 from the control unit 60 and operates the cylinder, not shown, or the like to make the container 41 closed condition.

Further, the panel heater 44 receives the heater control signal S44 from the control unit 60 to be configured to keep the temperature of the work 1 at 260 degrees C. based on the heater control signal S44. In this example, in the vacuum deaeration zone VI shown in FIG. 10, the temperature of the interior of the container 41 is kept at around 235 through 240 degrees C. during the point of time t5 to the point of time t6.

At a step ST63, the control portion 61 then starts the vacuum drawing processing on the chamber 40. In the vacuum drawing processing, the release valve 25 receives the release valve control signal S25 from the control unit 60 to release the initial open valve and the main open valve to their "full open" condition. The electromagnetic valve 22 receives the electromagnetic valve control signal S22 from the control unit 60 to drive the valve based on the electromagnetic valve control signal S22 so that the valve opening position thereof becomes "full open".

At a step ST64, the control portion 61 controls the electromagnetic valve 22 and the pump 23 to perform the vacuum drawing processing on the chamber 40 so that the interior of the chamber 40 becomes the set first target pressure P1. Around the "full open" of the valve opening position, the pump 23 receives the pump control signal S23 from the control unit 60 to perform the vacuum drawing processing on the chamber 40 based on the pump control signal S23. For example, the pump 23 operates to suck air within the container 41 by a fixed amount of suction.

At a step ST65, the control portion 61 then determines whether or not the vacuum pressure in the chamber 40 reaches the first target pressure P1. In this moment, the pressure sensor 24 detects pressure in the chamber 40 and outputs the pressure detection signal S24 (pressure detection information) to the control unit 60. In the control unit 60, the control portion 61 detects (verifies) the pressure in the chamber 40 based on the pressure detection signal S24. For example, it calculates the pressure from signal intensity (binary information of current value or voltage value) or refers to a table stored in ROM or the like in which a relationship between the signal intensity and the detection pressure is previously described.

If the vacuum pressure does not reach the first target pressure P1, the control portion 61 goes to a step ST66 where the control portion 61 continue the vacuum drawing processing on the chamber 40. In the continued vacuum drawing processing, the vacuum pressure in the chamber 40 is adjusted on the basis of the pressure detection signal S24 in the chamber 40 and set vacuum pressure. For example, the electromagnetic valve 22 and the release valve 25 are controlled so that a difference between calculated pressure value based on the signal intensity and detection pressure becomes lost.

The release valve 25 is set so that when the vacuum pressure in the chamber 40 is low, it receives the release valve control signal S25 and operates the initial open valve and the main open valve based on the release valve control signal S25 to supply $N_2$ gas, $H_2$ gas or the like into the chamber 40.

If the vacuum pressure reaches the first target pressure P1, the control portion 61 keeps the first target pressure P1 by a predetermined period of time (vacuum pressure keeping time T1 or the like) at a step ST67. Here, the control portion 61 keeps the vacuum pressure in the chamber 40 at the first target pressure P1 for the vacuum pressure keeping time T1 by closing the electromagnetic valve 22 so that valve opening position is fully closed or shutting the release valve 25. It is determined by starting a timer, for example, at the point of time t52 and detecting that the time is up based on equal comparison of time information or the like whether or not the vacuum pressure keeping time T1 elapses. If the vacuum pressure in the chamber 40 is less than it, the valve opening position becomes "full open" state and the vacuum drawing is performed.

When the vacuum pressure keeping time T1 then elapses, at a step ST68, the control portion 61 sets the second target pressure P2 with respect to the electromagnetic valve 22, the pump 23 and the release valve 25 to reopen the vacuum drawing processing on the chamber 40. The release valve 25 is set so that the initial open valve and the main open valve become "full open" state.

At a step ST69, the control portion 61 then determines whether or not the vacuum pressure in the chamber 40 reaches the second target pressure P2. In this moment, the pressure sensor 24 detects pressure in the chamber 40 and outputs the pressure detection signal S24 to the control unit 60. In the control unit 60, the control portion 61 detects the pressure in the chamber 40 based on the pressure detection signal S24. The criterion therefor is similar to a case described in the step ST65.

If the vacuum pressure does not reach the second target pressure P2, the control portion 61 goes to a step ST70 where the control portion 61 continue the vacuum drawing processing on the chamber 40. In the continued vacuum drawing processing, the vacuum pressure in the chamber 40 is adjusted on the basis of the pressure detection signal S24 in the chamber 40 and the set vacuum pressure. The adjustment method in this moment is similar to a case described in the step ST67.

If the vacuum pressure reaches the second target pressure P2, the control portion 61 keeps the second target pressure P2 by a predetermined period of time (vacuum pressure keeping time T2 or the like) at a step ST71. Here, the control portion 61 keeps the vacuum pressure in the chamber 40 at the second target pressure P2 for the vacuum pressure keeping time T2 by adjusting the electromagnetic valve 22 and the release valve 25. The vacuum pressure keeping time T2 is maximum settable time when the second target pressure P2 can be kept in the vacuum processing time without hindering the intermittent feeding in a case of setting the vacuum processing time so that the vacuum processing time is obtained by multiplying number of works by waiting unit time in intermittent feeding. When the vacuum processing time obtained by multiplying number of works by waiting unit time in intermittent feeding can be shortened, throughput of the vacuum reflow furnace is improved.

At a step ST72, the control portion 61 then determines whether or not the vacuum deaeration is complete. The criterion in this moment is performed by comparing the elapsed time Tx output from a timer, not shown, which starts at the same time when the vacuum pressure reaches the second target pressure P2 with the vacuum pressure keeping time T2 and detecting whether or not Tx equals T2, Tx=T2. A check continues in a case of Tx<T2. This check enables to be done the soldering (removal of voids) (vacuum defoaming/deaerating process) in which the vacuum pressure in the chamber 40 is kept at a set atmospheric pressure for a period of specified time.

The check finishes in a case of Tx=T2 and the control portion 61 goes to a step ST73 where the vacuum break in the chamber 40 starts. In this vacuum break, for example, the pump 23 stops and the release valve 25 operates to supply $N_2$ gas into the chamber 40 so that the vacuum pressure in the chamber 40 is increased. Of course, it may be increased by setting the target pressures P12, P1 and the like by multistage (see a property shown by a wave in FIG. 9).

When the vacuum pressure in the chamber 40 reaches the atmospheric pressure, the control portion 61 goes to a step ST74 where the control portion 61 controls the elevating mechanism 43 to elevate the container 41. The elevating mechanism 43 receives the elevating control signal S43 from the control unit 60 and operates a cylinder, not shown, and the like based on the elevating control signal S43 to make the container 41 an open state.

At a step ST75, the control portion 61 performs a work export process. The conveying mechanism 70 receives the conveying control signal S70 from the control unit 60 and operates the moving beam 28 based on the conveying control signal S70 to intermittently feed the work 1 (see FIG. 6A).

At a step ST76, the control portion 61 then branches off the control corresponding to the case where the work 1 is conveyed or not conveyed from the base 42 to the cooling portion 50. If the work 1 is not conveyed from the base 42 to the cooling portion 50, it returns to the step ST75 to continue the export process of the work 1. The conveying mechanism 70 is configured to convey a next work 1 onto the base 42 when the work 1 is conveyed out of the base 42.

If the work 1 is conveyed from the base 42 to the cooling portion 50, it returns to the step ST6 of the main routine and goes to a step ST7 from the step ST6. At the step ST7, the control portion 61 performs cooling process on the work 1. In this moment, the cooling portion 50 receives the cooling control signal S50 from the control unit 60 and operates the heat exchangers, fans and the like based on the cooling control signal S50 to cool the work 1 to around the normal temperature thereof. In the cooling zone VII shown in FIG. 10, the interior of the furnace is cooled to around 235 degrees C. to around the normal temperature thereof during the point of time t6 to the point of time t7. Accordingly, it is possible to perform the vacuum deaeration soldering on the work 1 at desired temperature, 260 degrees C. in this example.

At a step ST8, the control portion 61 then controls the conveying mechanism 70 to export the work 1 from the cooling portion 50 to the outside (see FIGS. 6A, 6B). At a step ST90, the control portion 61 then determines whether or not the vacuum soldering of all of the works 1 is complete. If the vacuum soldering of all of the works 1 is not complete, it returns to the step ST3 and continues to perform importing process of the work 1, heating process thereof, vacuum defoaming/deaerating process thereof and cooling process thereof. If the vacuum soldering of all of the works 1 is complete, it finishes the control.

Thus, according to the vacuum reflow furnace 100 as the embodiment, there is provided with the control portion 61 that adjusts the vacuum pressure in the chamber 40 to the set vacuum pressure in the chamber 40 based on the pressure detection signal S24 and keeps the set vacuum pressure for the predetermined period of time.

Such a configuration enables the interior of the chamber 40 to be kept at specified pressures multistage and to be fixedly kept by arbitrary time, so that it is possible to perform the soldering within the chamber 40, the vacuum pressure in which is optimally adjusted.

By the vacuum-soldering method according to this invention, it is possible to realize a constant vacuum pressure in the chamber 40 on the basis of a feedback control in the vacuum-soldering step in which the pressure in the chamber 40 is checked at any time while the chamber 40 is decompressed by the pump 23 and a suitable amount of inert gas such as $N_2$ gas is added thereinto according to the situation (constant pressure adjustment mechanism). Accordingly, it is possible to prevent the flux or solder from being scattered, and to perform the vacuum soldering with high quality of less voids 2 under the set vacuum pressure.

It is to be noted that when the step ST75 of the subroutine and the step ST8 of the main routine are controlled so to be operated together, the control of the step ST8 may be omitted. This allows the conveying control of the work 1 in the control portion 61 to be reduced.

Although the method of performing the feedback control on the release valve 25 to a specified vacuum pressure in the chamber 40 based on the pressure detection signal S24 when the vacuum pressure in the chamber 40 is adjusted multistage has been in the above-mentioned embodiments, this invention is not limited thereto; A feedback control method in which an amount of revolution of the pump 23 is limited on the basis of the pressure detection signal S24 to attain the constant vacuum pressure may be adopted.

Further, a method of changing (varying) decompressing speed freely to prevent the flux or solder from being scattered, not decompressing the interior of the chamber 40 at a fixed speed, may be adopted. Additionally, a method of adding any gas other than $N_2$ to attain a constant vacuum pressure may be adopted. They enable the interior of the chamber 40 to be kept at a specified vacuum pressure (atmospheric pressure).

Thus, based on the work 1 to be installed and various kinds of conditions, the vacuum pressure, a period of time when the set vacuum pressure is kept and the like can be suitably set. For example, when on the basis of intermittent waiting unit time of the work 1, the time when the work 1 stays in the preheating zones I, II, III and IV is set to be TA; the time when it stays in the main heating zone V is set to be TA; the time when it stays in the vacuum deaeration zone VI is set to be TB; and the time when it stays in the cooling zone VII is set to be TC, it is set so that their relationships are to be TC<=TB<=TA (see FIG. 9). By keeping their relationship, it is possible to perform the vacuum defoaming/deaeration process without breaking any control such as a collision or the like in the intermittent work feeding and the vacuum defoaming/deaerating process.

Further, the control portion may have any correction calculation function to perform any correction calculation on the vacuum pressure in the chamber 40, the vacuum pressure keeping time and the like, which have been set by the operation part 21, and on the intermittent waiting unit time of the work 1 to avoid the above-mentioned control break.

Additionally, with respect to the vacuum pressure control property shown in a solid line of FIG. 9, $\theta 1$ and $\theta 2$ indicate inclinations of the vacuum pressure control curve when forming the vacuum and $\theta 3$ through $\theta 5$ indicate inclinations of the vacuum pressure control curve when breaking the vacuum. These inclinations $\theta 1$ through $\theta 5$ can be adjusted (changed) by controlling output of the pump 23 and/or valve opening position of the release valve 25. Therefore, since it is possible to set any optimal conditions with respect to the intermittent work feeding and the vacuum defoaming/deaerating process, the throughput of the vacuum reflow furnace can be improved.

INDUSTRIAL AVAILABILITY

The invention is very preferably applicable to a vacuum reflow furnace which has a function to deaerate the vacuum molted solder when mounting a surface-mounting component or the like on a substrate at a predetermined position thereof and soldering the component and the substrate.

DESCRIPTION OF CODES

10 Main Body
11 Inlet
12 Outlet
13 Conveying Portion
16 Conveying Path
17, 27 Fixed Beam
18, 28 Moving Beam
20 Preheating Portion (Heating Portion)
21 Operation Part
23 Pump
24 Pressure Sensor
25 Release Valve
26 Arrival Sensor
29 Gas Supplying Portion
30 Main Heating Portion (First Heating Portion)
40 Chamber
41 Container
42 Base
43 Elevating Mechanism
44 Panel Heater (Second Heating Portion)
45, 46 Fixed Beam (Supporting Portion)
47 Pins
48 Seal Member
50 Cooling Portion
100 Vacuum Reflow Furnace

The invention claimed is:

1. A soldering apparatus comprising:
a chamber in which a work is solderable under vacuum environment;
an operation part that inputs and sets plural vacuum pressures in the chamber;
a pump that performs vacuum drawing on an interior of the chamber;
a detection portion comprising a pressure sensor that detects pressure in the chamber and outputs detection information about the pressure in the chamber; and
a control portion, wherein the control portion is configured to receive detection information from the detection portion and adjust the pressure in the chamber to the plural vacuum pressures by performing stepwise decompression of the chamber from a start of the decompression by steps based on the detection information about the pressure in the chamber, the detection information being output from the detection portion, wherein performing stepwise decompression of the chamber comprises at least two steps including a first step comprising reducing the pressure in the chamber from an initial pressure to a first set vacuum pressure which is maintained for a first predetermined period of time and a second step comprising reducing the pressure in the chamber from the first set vacuum pressure to a second set vacuum pressure which is maintained for a second predetermined period of time.

2. The soldering apparatus according to claim 1 comprising a gas-supplying portion that supplies at least any one of activated gas and inert gas to the chamber,
wherein the control portion adjusts an amount of the flowing gas which the gas-supplying portion supplies to the chamber.

3. The soldering apparatus according to claim 2 wherein when keeping the set plural vacuum pressures at the predetermined period of time, the control portion controls the pump to maintain its number of revolution at a predetermined number based on the detection information about the pressure in the chamber, the detection information being received from the detection portion, and controls the amount of the flowing gas to the chamber so that it keeps the set plural vacuum pressures for the predetermined period of time.

4. The soldering apparatus according to claim 2 wherein when keeping the set plural vacuum pressures for the predetermined period of time, the control portion controls the amount of the flowing gas to the chamber to be constant based on the detection information about the pressure in the chamber, the detection information being received from the detection portion, and controls number of revolution of the pump so that it keeps the set plural vacuum pressures for the predetermined period of time.

5. The soldering apparatus according to claim 1 comprising a first heating portion that heats the work up to a predetermined temperature before the work enters into the chamber.

6. The soldering apparatus according to claim 5 comprising a second heating portion that keeps the work which is heated up to the predetermined temperature before the work enters into the chamber, at a predetermined temperature when the work enters into the chamber.

7. A vacuum-soldering method comprising:
a step of inputting and setting plural vacuum pressures in the chamber in which a work is solderable under vacuum environment;
a step of performing vacuum drawing on an interior of the chamber to which the plural vacuum pressures are set;
a step of detecting pressure in the chamber;
a step of adjusting the plural vacuum pressures in the chamber based on detection information about the pressure in the chamber and the set plural vacuum pressures so as to perform multistage decompress from a start of the decompression by stages, wherein performing multistage decompress from the start of the decompression by stages comprises at least two stages including a first stage comprising reducing the pressure in the chamber from an initial pressure to a first set vacuum pressure which is maintained for a first predetermined period of time and a second stage comprising reducing the pressure in the chamber from the first set vacuum pressure to a second set vacuum pressure which is maintained for a second predetermined period of time; and
a step of performing the soldering in the chamber in which the plural vacuum pressures are adjusted.

8. The vacuum-soldering method according to claim 7 comprising a step of heating the work up to a predetermined temperature before the work enters into the chamber.

9. The vacuum-soldering method according to claim 8 comprising a heating step of keeping the work which is heated up to the predetermined temperature before the work enters into the chamber, at a predetermined temperature when the work enters into the chamber.

10. The soldering apparatus according to claim 2 comprising a first heating portion that heats the work up to a predetermined temperature before the work enters into the chamber.

11. The soldering apparatus according to claim 3 comprising a first heating portion that heats the work up to a predetermined temperature before the work enters into the chamber.

12. The soldering apparatus according to claim 4 comprising a first heating portion that heats the work up to a predetermined temperature before the work enters into the chamber.

13. The soldering apparatus according to claim 10 comprising a second heating portion that keeps the work which is heated up to the predetermined temperature before the work enters into the chamber, at a predetermined temperature when the work enters into the chamber.

14. The soldering apparatus according to claim 11 comprising a second heating portion that keeps the work which is heated up to the predetermined temperature before the work enters into the chamber, at a predetermined temperature when the work enters into the chamber.

15. The soldering apparatus according to claim 12 comprising a second heating portion that keeps the work which is heated up to the predetermined temperature before the work enters into the chamber, at a predetermined temperature when the work enters into the chamber.

* * * * *